United States Patent [19]

Segawa et al.

[11] Patent Number: 5,254,485

[45] Date of Patent: Oct. 19, 1993

[54] METHOD FOR MANUFACTURING BIPOLAR SEMICONDUCTOR DEVICE

[75] Inventors: Mizuki Segawa, Osaka; Shuichi Kameyama, Hyogo; Hiroshi Shimomura; Atsushi Hori, both of Osaka, all of Japan

[73] Assignee: Matsushita Electric Industrial Co., Ltd., Osaka, Japan

[21] Appl. No.: 760,987

[22] Filed: Sep. 17, 1991

[30] Foreign Application Priority Data

Sep. 18, 1990 [JP] Japan .................. 2-249457

[51] Int. Cl.$^5$ .................. H01L 21/265; H01L 29/70
[52] U.S. Cl. .................. 437/31; 437/27; 148/DIG. 10; 257/47
[58] Field of Search .................. 437/27-31; 148/10; 257/47

[56] References Cited

U.S. PATENT DOCUMENTS

| | | | |
|---|---|---|---|
| 4,980,305 | 12/1990 | Kadota et al. | 437/31 |
| 5,037,768 | 8/1991 | Cosentino | 437/31 |
| 5,116,770 | 5/1992 | Kameyama et al. | 148/DIG. 10 |
| 5,137,839 | 8/1992 | Niitsu | 437/31 |

FOREIGN PATENT DOCUMENTS 0003916  1/1990  Japan .................. 437/31

OTHER PUBLICATIONS

K. Kikuchi et al., *A High Speed Bi-Polar LSI Process Using Self-Aligned Double Diffusion Polysilicon Technology*, Proceedings of the International Electron Devices Meeting, pp. 420-423 (Los Angeles, Calif. Dec. 7-10, 1986).

S. Ozono et al, *Redistribution of Heavily Doped Arsenic in Poly-Si Film on Single Silicon Substrate during its Solid Phase Epitaxial Growth*, 177th Electrochemical Society Meeting, Abstract No. 378, pp. 569-570 (1990).

Primary Examiner—Olik Chaudhuri
Assistant Examiner—Long Pham
Attorney, Agent, or Firm—Willian Brinks Olds Hofer Gilson & Lione

[57] ABSTRACT

There is disclosed a method for manufacturing a bipolar semiconductor device in which emitter region and active base region are formed by implanting impurities of first and second conduction types in a first semiconductor region of the first conduction type to be a collector through a non-single crystalline semiconductor thin film, a second semiconductor thin film is formed on the first semiconductor thin film, and an impurity of the first conduction type is introduced in the second semiconductor thin film after patterning the first and second semiconductor thin film so as to form an emitter electrode.

11 Claims, 23 Drawing Sheets

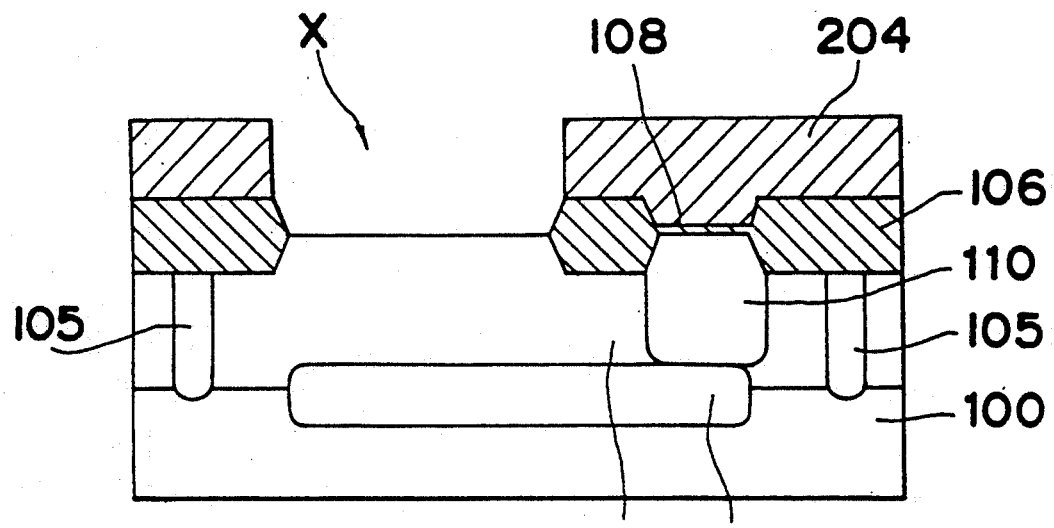
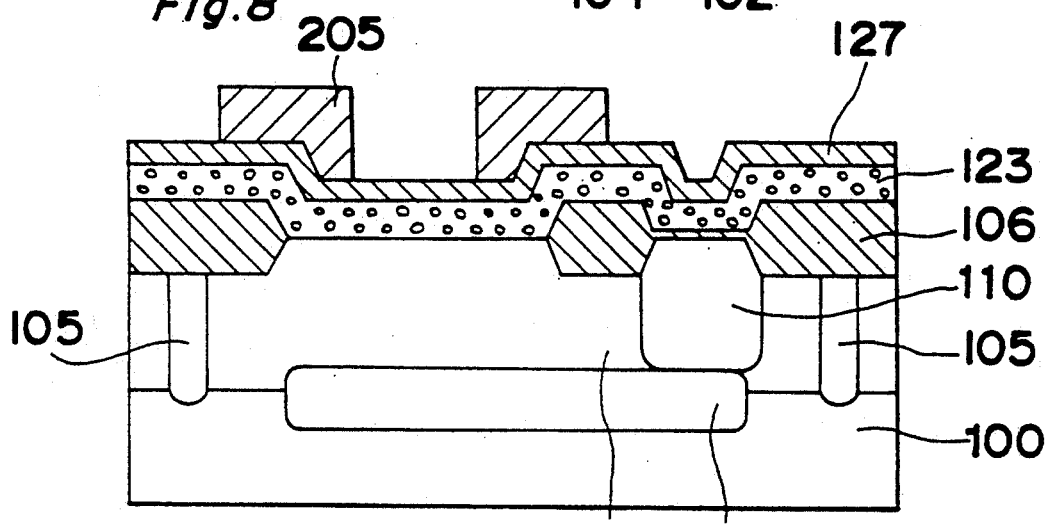
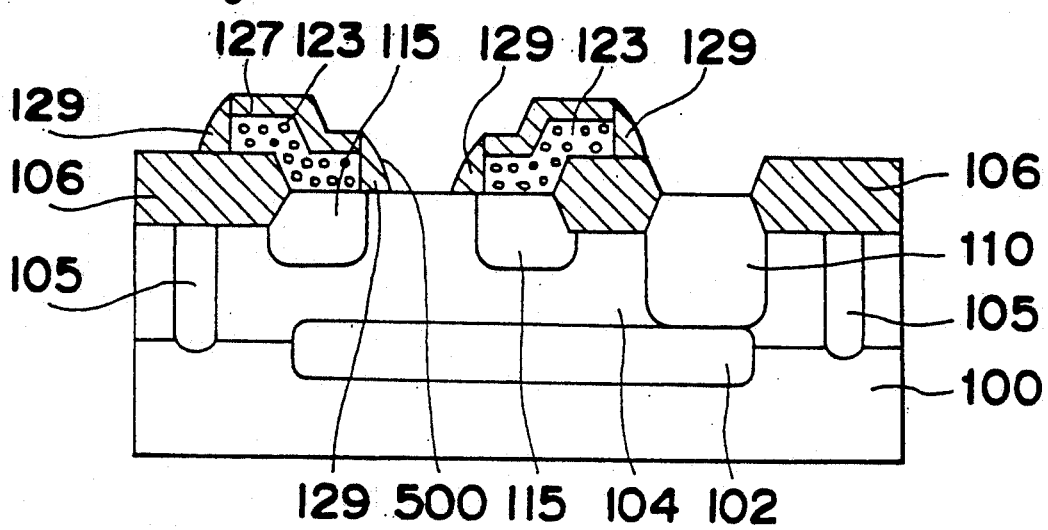

METHOD FOR MANUFACTURING BIPOLAR SEMICONDUCTOR DEVICE

BACKGROUND OF THE INVENTION

1. Field of the Invention

The present invention relates to a method for manufacturing a bipolar semiconductor device capable of improving the electric characteristic at the connection between an electrode made of a polycrystalline semiconductor thin film which is used in a transistor for a bipolar transistor integration circuit and a semiconductor region containing a high concentration of impurity which is formed in a single crystalline semiconductor substrate.

2. Description of the Prior Art

In the recent technology for silicon semiconductor bipolar device, it has been widely received that poly silicon (polycrystalline silicon) is used for a wiring material for forming a fine circuit and for a diffusion source for forming a shallow junction depth. Particularly, a use of a leading-out electrode composed of a poly silicon thin film is an essential technology for achieving an emitter region in a fine planer dimension suitable for high speed operation of the semiconductor bipolar device. (Poly silicon emitter technology)

The following three methods are representative for achieving the poly silicon emitter structure.

(1) A method for forming an emitter region by diffusing an impurity from a poly silicon film to be an electrode.

According to this method, after introducing an impurity into the poly silicon to be an electrode the emitter region is formed by diffusing the impurity from the poly silicon through a heat treatment.

For example, the emitter region having a shallow junction depth of 50 nano meter can be formed through a diffusion process of arsenic ions by heating the poly silicon thin film having arsenic ions in a dose amount of $1 \times 10^{16}$ cm$^{-2}$ implanted therein at a temperature of 900° for 30 min. A diffusion process of arsenic ions with the same poly silicon thin film as that of the above is carried out at a temperature of 1000° C. for 20 min. The result is to form an emitter region having a junction depth of 180 nano meter superior in the high speed operation. However, such a deep junction depth requires a diffusion process carried out at a high temperature and for a long heating time, which affects undesirably other semiconductor regions such as a base region formed at the foregoing step. That is, the base region is provided with a deeper junction depth which prevents a high speed operation. In other words, a heat treatment at a temperature of 1000° C. for 20 min. can achieve the formation of the emitter region having a deep junction depth of 180 nano meter and ensure the high speed operation of the resultant device. On the other hand, such a heat treatment has a disadvantage that the base region is provided with a deeper junction depth of 400 to 500 nano meter by the further diffusion of boron ions. This problem becomes more serious when the minimum dimension of an emitter diffusion window is 1 μm or less since it becomes difficult to diffuse the impurity for forming an emitter therethrough.

When a p-type base region is formed with an implantation apparatus having the most stable and the lowest acceleration energy commercially available (for example, 25 keV), the heat treatment for obtaining the emitter region having a junction depth of 180 nano meter which results in a superior high speed operation (1000° C. and 20 min.) causes the base region to have a junction depth of 500 nano meter. As a result of a difference between the junction depths of base region (500 nano meter) and the emitter (180 nano meter), the resultant transistor has a base width of 320 nano meter. A transistor with a base width of 320 nano meter is provided and typically has a collector cut-off frequency (ft) of 5 GHz. It is necessary for a transistor to be formed with a base region having a small base with such as 100 to 200 nano meter for easy manufacturing of a transistor of a high quality having a collector cut-off frequency (ft=10 GHz). In this case, the emitter region formed through a diffusion process from the poly silicon has a junction depth of 300 nano meter. The formation of an emitter with a deeper junction depth requires a heat treatment characterized by a high temperature and a long heating time. Under such a heat treatment, the base region is unwillingly provided with a considerably deep junction. As a result, it is impossible to achieve the formation of a transistor having a base width in a low level of about 100 to 200 nano meter.

(2) A method for depositing a poly silicon thin film after formation of an emitter region by ion implantation.

An emitter region according to this method is formed by implanting directly an impurity such as arsenic ions into a p-type base region. For example, a substrate has arsenic ions in a dose amount of $1 \times 10^{16}$ cm$^{-2}$ implanted thereunto with an acceleration energy of 50 keV and then heated at a temperature of 1000° C. The emitter region has a junction depth of about 100 nano meter after implantation and then of 260 nano meter after heating of 20 min. In the emitter formation method according to the method (1), the emitter region has a junction depth of about 180 nano meter after a diffusion of arsenic ions from the poly silicon carried out at a temperature of 1000° C. for 20 min. The emitter region according to the method (2) has a junction depth of 260 nano meter upon being subjected to the same heat treatment, that is (1000° C., 20 min.) which is larger by 80 nano meter than that of the emitter formed according to the method (1). The amount of implanted arsenic ions is higher with the method (2) than with the method (1). The higher amount of arsenic ions preferably causes the emitter to have a lower electric resistance. However, the implantation of an impurity such as arsenic ions causes the p-type base to have a rough surface. A silicon oxide thin film (referred to as a "native oxide film" hereinafter) is spontaneously formed between a substrate of a single crystal silicon and a poly silicon thin film for use in a leading-out electrode. The rough surface of the substrate causes the native oxide film to grow irregularly. The variation in the thickness of the native oxide film results in an undesirable increase in the serial electrical resistance at the emitter region.

(3) A method for forming an emitter region by implanting an impurity through a polycrystalline semiconductor thin film such as poly silicon.

This method forms an emitter region by implanting an impurity such as arsenic ions of an n-type into a base of a p-type through a thin film of poly silicon. An emitter region according to a method (3) is formed by implanting an impurity such as arsenic into a silicon substrate with an acceleration energy of 70 keV (higher by 20 keV than that of the method (2)) and is provided with an impurity distribution the same as that of method (2). In addition, the higher acceleration energy according to the method (3) can break the native oxide film formed between the substrate of a single crystal silicon and the poly silicon thin film and accordingly improve the ohmic contact between the semiconductor thin film to be a leading-out electrode and the emitter region. This results in a decrease in the serial electric resistance at the emitter region. Since it becomes difficult to remove the native oxide film before depositing a non-single crystalline thin film as the size of an emitter diffusion window is miniaturized, variety in the electric property among transistors formed in the same wafer or among wafers in the same batch increases undesirably.

A first problem to be solved by the invention is to remove an undesirable effect due to the native oxide film formed between a silicon substrate of a single crystal form and the poly silicon. This native oxide film grows up to a thickness of 2 nano meter with the poly silicon film or amorphous silicon thin film as deposited. The increase in the thickness of this native oxide film causes the diffusion length of an impurity in an emitter region, that is, the junction depth to be irregularly lower or higher, and further results in an increase in the serial electrical resistance of the resultant emitter region. Accordingly, there have been problems that degrade the transistor characteristic and that increase the variation of the properties.

This problem further increases the difficulty in leading-out an electrode film of a poly silicon or amorphous silicon from an emitter region after formation of an emitter having a deep junction through an ion implantation process according to the emitter formation method shown in the method (2). As mentioned above, the native oxide film grows between the substrate of a single crystal silicon and the poly silicon film. The growth rate is higher with the substrate including a higher concentration of impurity such as arsenic ions than with the substrate including a lower concentration of impurity. As a result, the substrate including a higher concentration of impurity degrades the ohmic contact between the emitter region and the deposited poly silicon thin film and results in a rapid increase in the serial electric resistance of the emitter region.

A second problem of the present invention is to form the junction at a considerably greater depth with a heat treatment at lower temperature and for a short heating time. When an emitter having a junction in a given depth can be formed through a heat treatment at a lower temperature for the short heating time, it is possible to achieve a transistor structure having a narrow base width superior in the high speed operation without changing the profile of an impurity of the base. For example, the formation of the emitter having the junction depth of 300 nano meter requires a heat treatment at a temperature of 1000° C. for 60 min., which causes the base region formed at the foregoing step to have the impurity diffused further thereunto. Accordingly, this has been a problem preventing the achievement of the transistor structure suitable for high speed operation.

In the method (3) according to the prior art, an emitter region is formed by implanting the impurity ions into a p-type base region through a semiconductor thin film of a non-single crystal form such as a poly crystal silicon or an amorphous silicon. A variation in the thickness of a polycrystalline semiconductor thin film form affects undesirably the junction depth of the emitter region. Accordingly, this causes a variation in the base width which is a difference between the junction depths of an emitter and the junction depth of the base region formed with the ion implantation process at the foregoing step. The resultant transistors have a variation in the electric characteristic.

SUMMARY OF THE INVENTION

In view of the problems mentioned above, an object of the present invention is to provide a method for manufacturing a bipolar semiconductor device having a stable characteristic and a transistor structure suitable for high speed operation. When an electrode is formed from a semiconductor thin film of a non-single crystal form such as a poly crystal silicon or an amorphous silicon deposited on a substrate composed of a single crystal silicon, a native oxide film is formed between the substrate and the electrode film of a poly crystal silicon and has an undesirable effect on the resultant device. The method for manufacturing bipolar semiconductor device according to the present invention is to remove the undesirable effect of the native oxide film and further to form an emitter region and a base region having given junction depths through a heat treatment at a lower temperature for a shorter heating time.

A method for manufacturing a bipolar semiconductor device according to claim 1 can be achieved by a method comprising steps of; a first step for forming a first polycrystalline semiconductor thin film form on the surface of a first semiconductor region of a single crystal form which is of a first electric conduction type to be a collector; a second step for forming a second semiconductor region of a first electric conduction type to be an emitter in said first semiconductor region by implanting an impurity of a first electric conduction type through said first semiconductor thin film; a third step for forming a third semiconductor region of a second electric conduction type to be a base by implanting an impurity of a second electric conduction type through said first semiconductor thin film; a fourth step of forming a second polycrystalline semiconductor thin film form on said first semiconductor thin film; and a fifth step of including an impurity of a first electric conduction type in said second semiconductor thin film.

A method for manufacturing a bipolar semiconductor device according to claim 2 can be achieved by a method comprising steps of: forming a base leading-out electrode film for leading-out a base composed of a semiconductor thin film of a second electric conduction type on a first semiconductor region of a first electric conduction type composed of single crystal to be a collector; forming a first insulating film on said base leading-out electrode film; forming at least one opening on said first semiconductor region by etching selectively and sequentially said base leading-out electrode film and said first insulating film; forming an external base composed of a semiconductor region of a second electric conduction type in said first semiconductor region positioned beneath said base leading-out electrode film; forming a second insulating film at the side wall of said base leading-out electrode film; forming a link base region composed of a semiconductor region of a second electric conduction type at said first semiconductor region to link said external base by implanting an impurity of a second electric conduction type into said opening in a inclined direction; forming a first semiconductor thin film of a non-single crystal form over all the surface; forming a second semiconductor region of a first electric conduction type to be an emitter in said first semiconductor region; forming a third semiconductor region of a second electric conduction type to be a base by implanting an impurity of a second electric conduction type through said first semiconductor thin film; forming a second semiconductor thin film on said first semiconductor thin film; and making an emitter from first semiconductor thin film and second semiconductor thin film formed on said opening by forming a pattern on said first and second semiconductor thin films while including an impurity of a first electric conduction type into said second semiconductor thin film.

A method for manufacturing a bipolar semiconductor device according to claim 3 is achieved by a method comprising steps of; forming an electrode film for leading-out a base composed of a semiconductor thin film of a second electric conduction type on a first semiconductor region of a first electric conduction type composed of single crystal to be a collector; forming a first insulating film on said base leading-out electrode film; forming at least one opening on said first semiconductor region by etching selectively and sequentially said base leading-out electrode film and said first insulating film; forming an external base composed of a semiconductor region of a second electric conduction type in said first semiconductor region positioned beneath said base leading-out electrode film; forming a second insulating film at the side wall of said base leading-out electrode film and a third insulating film on said opening; forming a link base region composed of a semiconductor region of a second electric conduction type at said first semiconductor region to link said external base by implanting an impurity of second electric conduction type through said third insulating film on said opening; forming a first semiconductor thin film of a non-single crystal over all the surface; forming a second semiconductor region of a first electric conduction type to be an emitter in said first semiconductor region; forming a third semiconductor region of a second electric conduction type to be a base at the outside of said second semiconductor region of a first electric conduction type to be an emitter by implanting an impurity of a second electric conduction type through said first semiconductor thin film; forming a second semiconductor thin film on said first semiconductor thin film; and making an emitter from the first semiconductor thin film and second semiconductor thin film formed on said opening by forming a pattern on said first and second semiconductor thin films while including an impurity of a first electric conduction type into said second semiconductor thin film.

A method for manufacturing a bipolar semiconductor device according to claim 4 can be achieved by a method comprising steps of; forming a first conduction film on a first semiconductor region of a first electric conduction type composed of single crystal to be a collector; forming a third semiconductor region of a second electric conduction type to be a base through said first semiconductor thin film; forming a second semiconductor region of a first electric conduction type necessary for the formation of an emitter by implanting an impurity of a first electric conduction type through said first semiconductor thin film; forming a second conduction film on said first conduction film; forming a semiconductor thin film patter for use in an emitter electrode by patterning said first semiconductor thin film and said second semiconductor thin film; removing selectively said third semiconductor region of a first electric conduction type except for an area forming the semiconductor thin film for use in an emitter electrode and forming a residual semiconductor region to be an emitter in a second semiconductor region at a position beneath said semiconductor thin film pattern for use in a formation of an emitter electrode; leaving said first insulating film in a side-wall form at the side of said residual semiconductor region; forming a fourth semiconductor region of a second electric conduction type to be an external base by introducing an impurity of a second electric conduction type into said first semiconductor region under use of said residual insulating film and said semiconductor thin film pattern for use in a formation of an emitter electrode as a mask; and connecting said fourth semiconductor region to said second semiconductor region.

A method for manufacturing a bipolar semiconductor device according to claim 6 can be achieved by a method comprising steps of; forming a first conduction film on a first semiconductor region of a first electric conduction type composed of single crystal to be a collector; forming a third semiconductor region of a second electric conduction type to be a base through said first semiconductor thin film; forming a second semiconductor region of a first electric conduction type necessary for the formation of an emitter by implanting an impurity of a first electric conduction type through said first semiconductor thin film; forming a second conduction film on said first conduction film; forming a semiconductor thin film pattern for use in a formation of an emitter electrode by patterning said first semiconductor thin film and said second semiconductor thin film; removing selectively said third semiconductor region of a first electric conduction type except for an area forming the semiconductor thin film for use in an emitter electrode and forming a residual semiconductor region to be an emitter in a second semiconductor region at a position beneath said semiconductor thin film pattern for use in a formation of an emitter electrode; forming a fifth semiconductor region of a second electric conduction type to be a link base by introducing an impurity of a second electric conduction type in said second semiconductor region under use of said semiconductor thin film pattern for use in a formation of an emitter electrode; leaving said first insulating film in a side-wall form at the side of said residual semiconductor region after formation of said fifth semiconductor region; forming a fourth semiconductor region of a second electric conduction type to be an external base by introducing an impurity of a second electric conduction type into said first semiconductor region under use of said residual insulating film and said semiconductor thin film pattern for use in a formation of an emitter electrode as a mask; and connecting said fourth semiconductor region to said second semiconductor region through said fifth semiconductor region.

A method for manufacturing a bipolar semiconductor device according to claim 8 can be achieved by a method comprising steps of; forming a first conduction film on a first semiconductor region of a first electric conduction type composed of single crystal to be a collector; forming a third semiconductor region of a second electric conduction type to be a base through said first semiconductor thin film; forming a second semiconductor region of a first electric conduction type necessary for the formation of an emitter by implanting an impurity of a first electric conduction type through said first semiconductor thin film; forming a second conduction film on said first conduction film; forming a semiconductor thin film pattern for use in a formation of an emitter electrode by patterning said first semiconductor thin film and said second semiconductor thin film; removing selectively said third semiconductor region of a first electric conduction type except for an area forming the semiconductor thin film for use in an emitter electrode and forming a residual semiconductor region to be an emitter in a second semiconductor region at a position beneath said semiconductor thin film pattern for use in a formation of an emitter electrode; leaving said first insulating film in a side-wall form at the side of said residual semiconductor region; forming a fifth semiconductor region of a second electric conduction type to be a link base by introducing an impurity of a second electric conduction type in said first semiconductor region under use of said residual insulating film and said semiconductor thin film pattern for use in a formation of an emitter electrode and connecting said fifth semiconductor region to said second semiconductor region; leaving said second insulating film in a side-wall form at the side of said first insulating film left in a side-wall form after formation of said fifth semiconductor region; forming a fourth semiconductor region of a second electric conduction type to be an external base by introducing an impurity of a second electric conduction type into said first semiconductor region under use of said residual insulating film and said semiconductor thin film pattern for use in a formation of an emitter electrode as a mask; and connecting said fourth semiconductor region to said fifth semiconductor region.

According to the present invention, the following merits are obtained.

(1) A method for manufacturing a bipolar semiconductor device according to the present invention is to implant impurities of a first type of conduction and a second type of conduction through a first semiconductor thin film of a poly silicon so as to suppress an effect of the native oxide film. It is possible to form a second semiconductor region of a first electric conduction type to be an emitter and a third semiconductor region of a second electric conduction type to be a base, both of which are provided with a shallower junction than the conventional device by a heat treatment at a lower temperature and a shorter heating time. The resultant bipolar semiconductor device obtained by the method according to the present invention is provided with a narrow base width and accordingly can be operated at a high speed.

(2) The ion implantation carried out through a first semiconductor thin film of a poly silicon can break the native oxide film formed between the first semiconductor thin film and the substrate of a single crystal silicon. This improves the ohmic contact between the leading-out electrode composed of a second semiconductor thin film and the emitter composed of a second semiconductor of a first electric conduction type. As a result, it is possible to reduce the serial electric resistance of the emitter.

(3) The method according to the present invention is to form a second and a third semiconductor region to be an emitter and a base, respectively by implanting impurities of a first type of conduction and second type of conduction through a first semiconductor thin film of a poly silicon and can suppress the variation in the base width due to variation in the thickness of the semiconductor thin film. That is, with the first semiconductor thin film deposited thin, both the emitter and the base are provided with a deep junction. On the other hand, with the first semiconductor thin film deposited thick, both the emitter and the base are provided with a shallow junction. Therefore, the variation in the thickness of the first semiconductor thin film does not affect the base width because the base width is the difference between the base depth and the emitter depth.

(4) Further, the method according to claim 2 or 3 of the present invention is to introduce first impurities of first and second types of conduction at a position beneath the second insulating film through an opening in a self-adjusting way to form a link base region before forming the second semiconductor region of a first type of conduction to be an emitter and the third semiconductor thin film of a second type of conduction through an implantation process of impurities of a first electric conduction type and second electric conduction type through a first semiconductor thin film. This ensures the electric connection between the base and the external base region.

(5) According to the manufacturing method as claimed in either one of claim 4, 6, or 8, since the first semiconductor thin film is flat before any steps of the ion implantation for forming emitter and active base regions, the depth of the junctions at the peripheral portions of the emitter and active base regions can be made substantially equal to the depth at the central portions thereof. This contributes to decreased changes in the electric property which might be caused by miniaturizing the size of the emitter.

(6) According to the manufacturing method as claimed in claim 8, since side walls are formed twice in such a manner that a link base region having a suitable concentration of impurity and profile at first and, then, an external base region are formed by ion implantations in a self-adjusting way, it becomes possible to connect the active base region and the external base region with each other reliably by adjusting the thicknesses of the first and second side walls while maintaining the credibility of the bipolar semiconductor devices.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 7 shows a cross-sectional view of a major portion of a bipolar transistor obtained at the first step of a method for manufacturing a bipolar semiconductor device according to the second embodiment of the present invention.

FIG. 8 shows a cross-sectional view of a major portion of a bipolar transistor obtained at the second step of a method for manufacturing a bipolar semiconductor device according to the second embodiment of the present invention.

FIG. 9 shows a cross-sectional view of a major portion of a bipolar transistor obtained at the third step of a method for manufacturing a bipolar semiconductor device according to the second embodiment of the present invention.

DETAILED DESCRIPTION OF THE PREFERRED EMBODIMENTS

Figure 1:
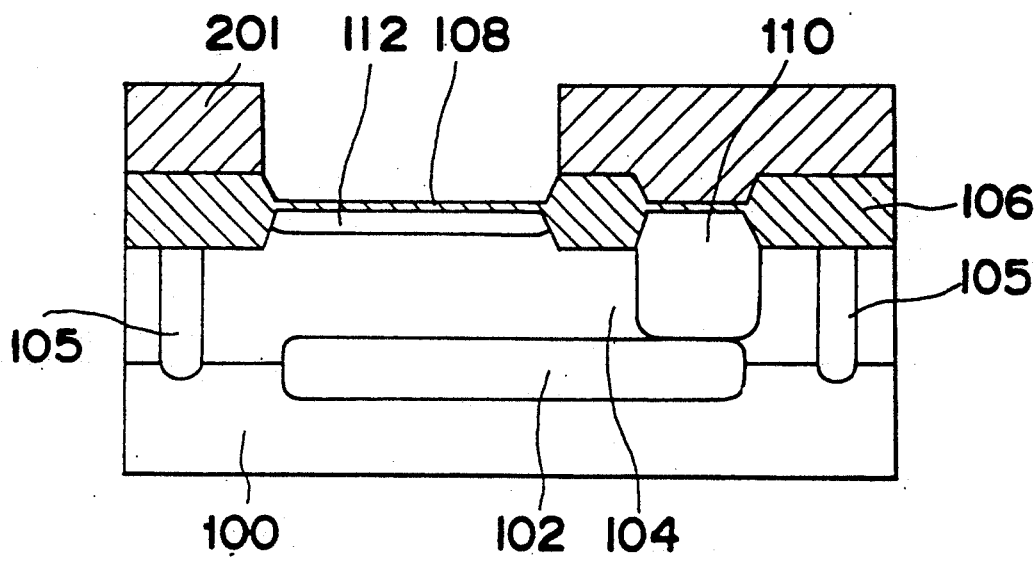
FIG. 1 shows a cross-sectional view of a major portion of a bipolar transistor obtained at the first step of a method for manufacturing a bipolar semiconductor device according to the first embodiment of the present invention.

FIGS. 1 to 6 show cross-sectional views of major portions of npn-type bipolar transistors obtained at various steps of a method for manufacturing a bipolar semiconductor device according to the first embodiment of the present invention. Referring to FIG. 1, a p-type silicon semiconductor substrate 100 first has an n+ buried layer 102, a p-type buried layer 105 acting as a channel stopper for separating electrically active regions from each other and an n-type epitaxial semiconductor layer 104 of a given thickness acting as a first semiconductor region, and then has $Si_3 N_4$ film (not shown in FIG. 1) deposited thereon, which is used for a LOCOS method (local oxidation method) due to a LP-CVD method (low pressure CVD method). After that, the $Si_3 N_4$ film is removed at an area which is to be formed into an oxide film 106 in a given thickness for separating elements from each other. After the $Si_3 N_4$ film at the other area is removed, the epitaxial semiconductor layer 104 has an implanting protecting oxide film 108 composed of a thin silicon oxide film of a thickness of about 30 nano meter formed thereon, and then further a resist pattern is applied thereto (not shown in FIG. 1). A collector wall diffusion layer 110 is formed by implanting n-type impurities under masking of the resist pattern and by carrying out thermal diffusion. After formation of another resist pattern 201, a working step is then to form a p-type link base 112 for connecting an active base region to be formed later and a graft base region by implanting boron in a dose amount of 1 to $3 \times 10^{12}$ cm$^{-2}$ with ion implantation process under a low energy acceleration of 15 keV.

Figure 2:
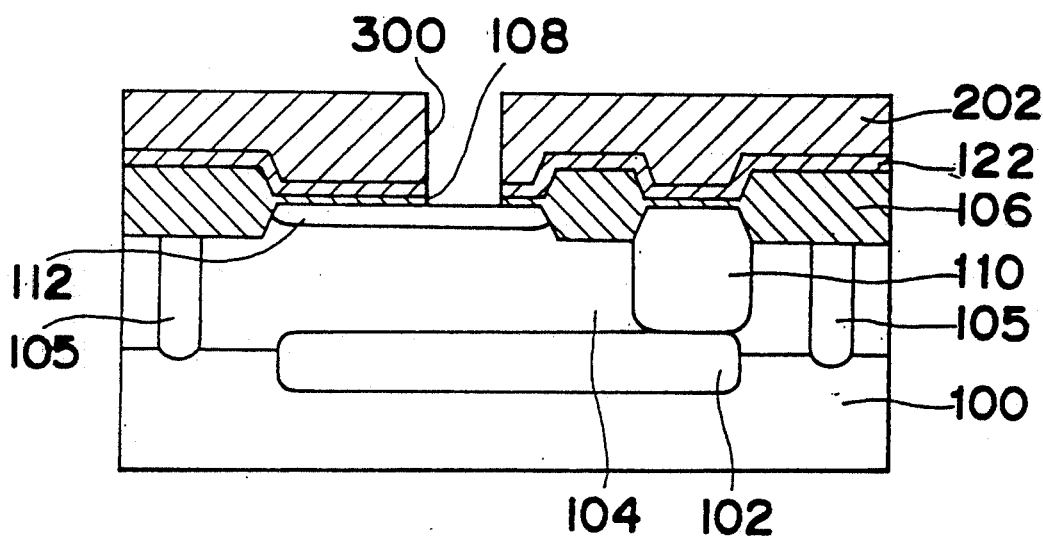
FIG. 2 shows a cross-sectional view of a major portion of a bipolar transistor obtained at the second step of a method for manufacturing a bipolar semiconductor device according to the first embodiment of the present invention.

Next, as shown in FIG. 2, a silicon oxide film 122 for use as an insulating film is deposited on a total surface of field oxide 106 and the implanting protecting oxide film 108 by a LP-CVD method after removal of the resist pattern. A next step is to form a resist pattern 202 by a usual photo-mask process and then to form an opening 300 by etching the implantation protecting oxide film 108 and the silicon oxide film 122.

Figure 3:
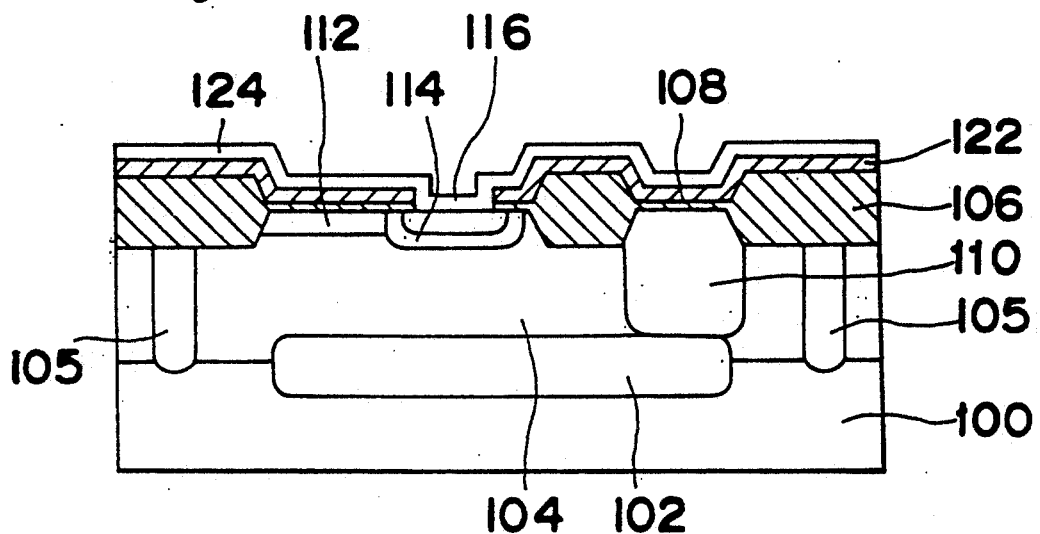
FIG. 3 shows a cross-sectional view of a major portion of a bipolar transistor obtained at the third step of a method for manufacturing a bipolar semiconductor device according to the first embodiment of the present invention.

As shown in FIG. 3, the next step is to deposit a silicon thin film (the first semiconductor thin film) of a thickness of about 30 nano meter composed, for example, poly crystal silicon on the area having the resist pattern removed therefrom. Then, an n-type emitter region 116 (a second semiconductor region) of a junction depth of about 180 nano meter is formed by implanting arsenic ions in a dose amount of 1 to $3 \times 10^{15}$ cm$^{-2}$ with ion implantation process under an acceleration energy of 60 to 80 kev through the silicon thin film 124. Further, the ion implantation process forms a p-type active base region (a third semiconductor region) 114 by implanting boron ions in a dose amount of 1 to $3 \times 10^{13}$ cm$^{-2}$ through the silicon thin film 124 at an acceleration energy of 40 to 50 keV.

Figure 4:
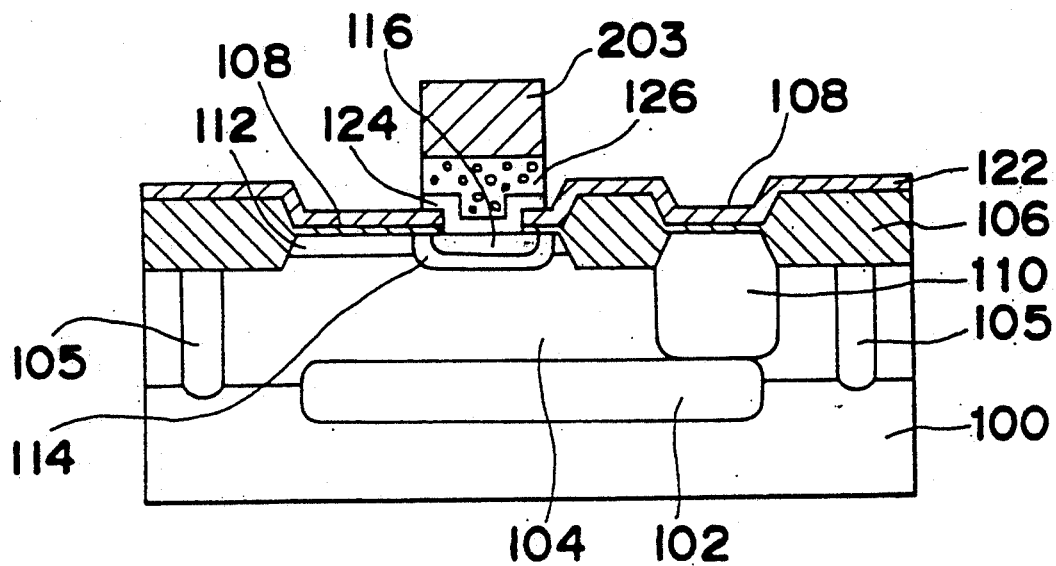
FIG. 4 shows a cross-sectional view of a major portion of a bipolar transistor obtained at the fourth step of a method for manufacturing a bipolar semiconductor device according to the first embodiment of the present invention.

Next, as shown in FIG. 4, the silicon thin film 124 has a poly silicon thin film 126 of a thickness of about 300 nano meter (a second semiconductor thin film) formed thereon. The poly silicon thin film 126 has the arsenic ions in a dose amount of $1 \times 10^{15}$ cm$^{-2}$ at an acceleration energy of 40 keV implanted thereunto. Then, a resist pattern 203 is formed through a photo-mask process. After that, an electrode for connecting the emitter is formed by carrying out an isotropic etching of the poly silicon crystal using the resist pattern as a mask.

Figure 5:
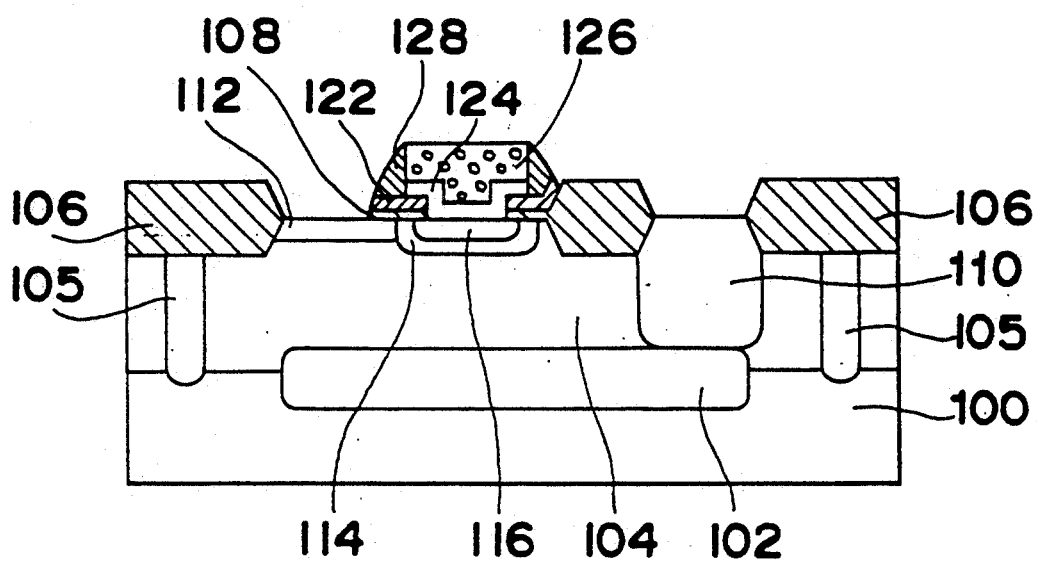
FIG. 5 shows a cross-sectional view of a major portion of a bipolar transistor obtained at the fifth step of a method for manufacturing a bipolar semiconductor device according to the first embodiment of the present invention.

As shown in FIG. 5, the next step is to deposit a silicon oxide film for use as a side wall after removal of the resist pattern 203. Then, an execution of the anisotropic etching permits the formation of side wall silicon oxide wall 128.

Figure 6:
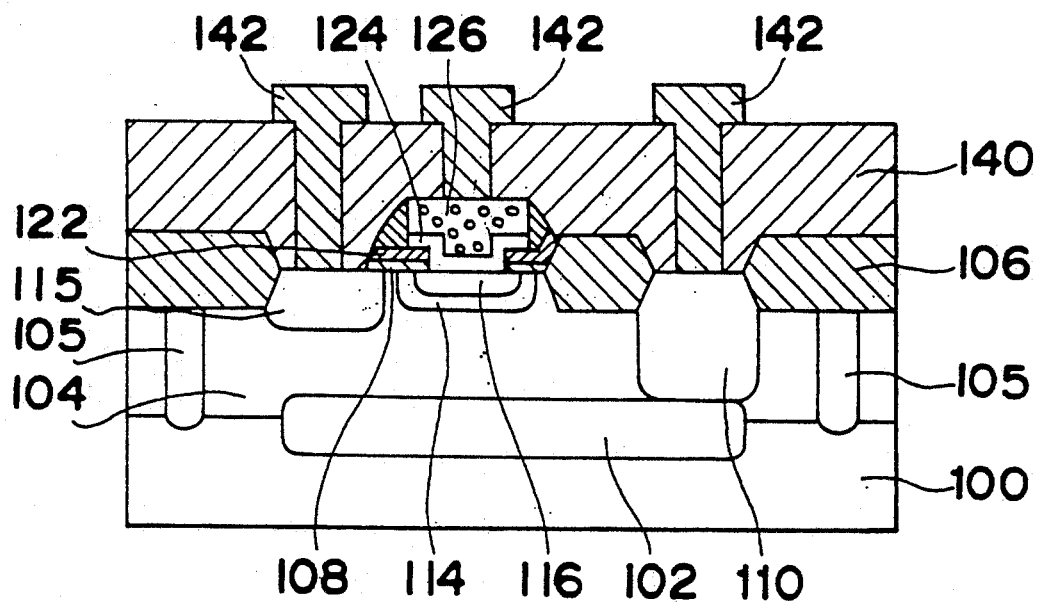
FIG. 6 shows a cross-sectional view of a major portion of a bipolar transistor obtained at the final step of a method for manufacturing a bipolar semiconductor device according to the first embodiment of the present invention.

A final step is to form a graft base region 115 by the ion implantation process and to deposit, on all of the surface available, a BPSG film 140 for use in protecting film as shown in FIG. 6. The BPSG film 140 is made flat by a heat treatment and is provided with contact windows for forming an electric circuit of emitter, collector and base.

Figure 36:
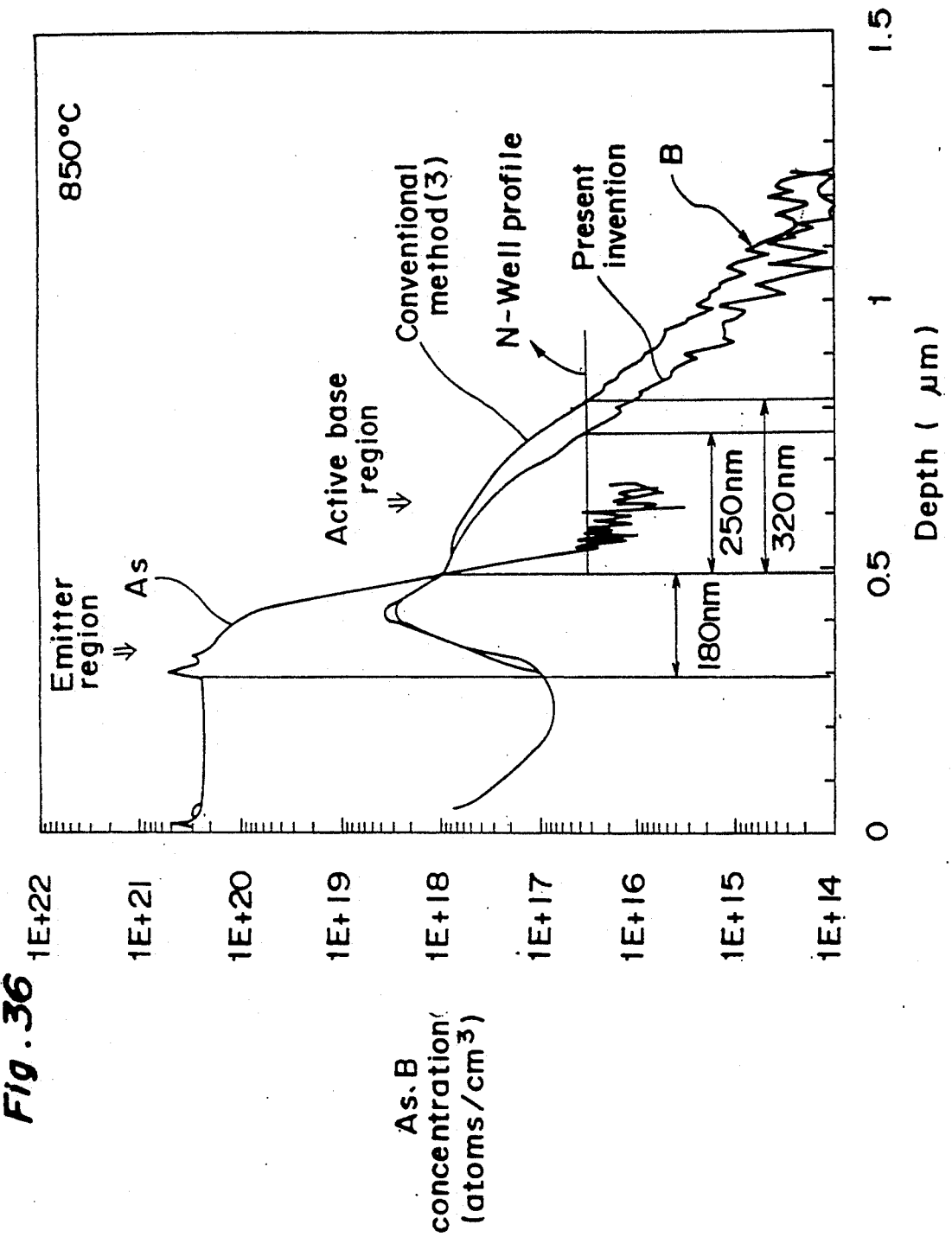
FIG. 36 shows a graph of SIMS profile indicating the relationship between an implantation depth and an impurity concentration of arsenic ions and boron ions.

A bipolar transistor of an npn type obtained in such a way is provided with a high current amplifying ratio and an excellent ohmic contact. The base having a narrow width of 200 nano meter can form an active base region 114 characterized by a high speed response. For example, FIG. 36 shows a difference in the SIMS profile for the concentration of arsenic or boron between the emitter regions according to the prior art and the present invention. According to the prior art, the active base region is formed by directly implanting boron ions into a first semiconductor region to be a collector at an acceleration energy of 25 keV in advance of the formation of the emitter. On the other hand, in the emitter and base formation method according to the present invention, the active base region is formed by implanting boron ions through the silicon thin film 124 to be a first semiconductor thin film at an acceleration energy of 40 keV. The impurity concentration profile of arsenic and boron is shown at a position apart from the surface of the poly silicon thin film 126 which has a thickness of 300 nano meter and which is to be a second semiconductor thin film. The formation condition of the emitter according to both methods is the arsenic ion implantation of a dose amount, $2 \times 10^{15}$ cm$^{-2}$ and an acceleration energy, 70 keV and the boron ion implantation of a dose amount, $4 \times 10^{13}$ cm$^{-2}$. Both methods are subjected to the same heat treatment, that is, heated at a temperature of 850° C. for 30 min., and are provided with the emitter diffusion depth of about 180 nano meter. The difference between the two methods is the base width. The prior art method produces the base width of 320 nano meter but the method according to the present invention produces the base width of 250 nano meter capable of forming an active base region 114 having a narrower base. It should be noted that the method according to the present invention is to form the emitter region 116 and the active base region 114 having a shallower junction depth and the base width of 100 nano meter which is capable of forming a structure to achieve a higher speed response by using a lower acceleration energy for the implantation of arsenic ions or boron ions. Since the method according to the present invention is to implant arsenic ions or boron ions through the silicon thin film 124 to be a first semiconductor thin film for use in a leading-out electrode, it is possible for the method according to the present invention to form the emitter region 116 having a desirable depth through a heat treatment at a lower diffusion temperature and a shorter heating time thus reducing an undesirable effect on the contact electric resistance due to a native oxide film. In addition, when compared with the prior art method forming only the emitter region by implanting ions through the semiconductor thin film as shown in the embodiment (3) according to the prior art, the method according to the present invention has the following feature that the variation in the thickness of the semiconductor thin film does not strongly effect the variation in the base width which has a large effect on the characteristic of the bipolar transistor. That is, the embodiment according to the present invention is to form the emitter region 116 and the active base region 114 by implanting ions of an n-type impurity and a p-type impurity through the silicon thin film 124. There may be a variation in the thickness of the thin film 124 among the substrates in the same batch or in the same wafer during the manufacturing process of, for example, CVD method. A part having a silicon thinly film 124 deposited thin thereon is formed to have an emitter region 116 and a base region 114 at a large depth. On the other hand, a part having a silicon thin film 124 deposited thickly thereon is formed to have an emitter region 116 and a base region 114 at a shallow depth. As a result, a variation in the thickness of the silicon thin film 124 does not strongly affect the base width which is the difference between the depths of active base region 114 and emitter region 116.

Referring now to FIGS. 7 to 13, the description will be directed toward a second embodiment wherein an npn type of bipolar transistor is prepared by using a method for manufacturing a bipolar semiconductor device according to the present invention. The second embodiment of the present invention is the first case in which a method for manufacturing a bipolar semiconductor device according to the present invention is applied to a technology with a double poly silicon self-alignment emitter. FIGS. 7 to 13 are cross-sectional views of npn-type bipolar transistors obtained at various steps of a method for manufacturing a bipolar semiconductor device according to the present invention.

Referring to FIG. 7, a p-type silicon semiconductor substrate 100 first has an n+ buried layer 102, a p-type buried layer 105 acting as a channel stopper for separating electrically elements from each other and an n⁻ type epitaxial semiconductor layer 104 in a given thickness acting as a first semiconductor region formed thereon. An element separation oxide film 106 in a given thickness is formed on the surface of the semiconductor layer 104 by a LOCOS method (local oxidation method). Further, the epitaxial semiconductor thin film 104 has a thin silicon oxide film of a thickness of 30 nano meter and which is to be an implantation protecting film 108 and subsequently a collector wall diffusion layer 110 formed thereon.

In a different way from that of the first embodiment of the present invention, after formation of resist pattern 204, a selective etching carried out under a use of the resist pattern 204 removes the implantation protecting oxide film 108 above a region for base and emitter.

A next step shown in FIG. 8 is to form a poly silicon thin film 123 to be an electrode for leading-out a base at the surface after removal of the resist pattern. The poly silicon thin film 123 has boron ions in a dose amount of 1 to $3 \times 10^{15}$ cm$^{-2}$ implanted with an acceleration energy of 40 to 50 keV thereunto. The ion implantation process forms a poly silicon to silicon oxide film 127 acting as a first insulating film. The surface of the poly silicon to silicon oxide film 127 has a resist pattern 205 for use in a formation of a base electrode formation formed thereon by a photo mask technology. It is noted that the poly silicon to silicon oxide film 127 acts as a layer to layer insulating film between the poly silicon thin film 123 and a poly silicon thin film for use in an electrode for leading-out an emitter to be formed later.

The next step shown is FIG. 9 is to form openings (not shown in FIG. 9) on the epitaxial semiconductor layer 104 by etching selectively the poly silicon to silicon oxide film 127 and the poly silicon thin film 123 under use of the resist pattern acting as a mask. Then, a silicon oxide film is deposited on all the surface available after removal of the resist pattern 205.

The subsequent anisotropic etching causes the silicon oxide film to form a pattern leaving the silicon oxide film at the side wall of the poly silicon to silicon oxide film 127 and the poly silicon thin film 123, which is referred to as a side-wall silicon oxide film 129. The side-wall silicon oxide film 129 left at the side wall of the poly silicon thin film 123 causes an opening 500 positioned over a region x for the formation of a base and emitter to be smaller than an opening formed by the resist pattern 205 and accordingly causes the size of the emitter to be lower in a self-adjusting way. In a manufacturing step shown in FIG. 8, boron ions implanted into the poly silicon thin film 123 diffuse into the poly silicon to silicon oxide film 127 and the side-wall silicon oxide film 129. The subsequent step for the heat treatment causes the boron ions in the poly silicon thin film 123 to move out from the poly silicon thin film 123 to form finally a graft base region 115 to become an external base region.

Figure 10:
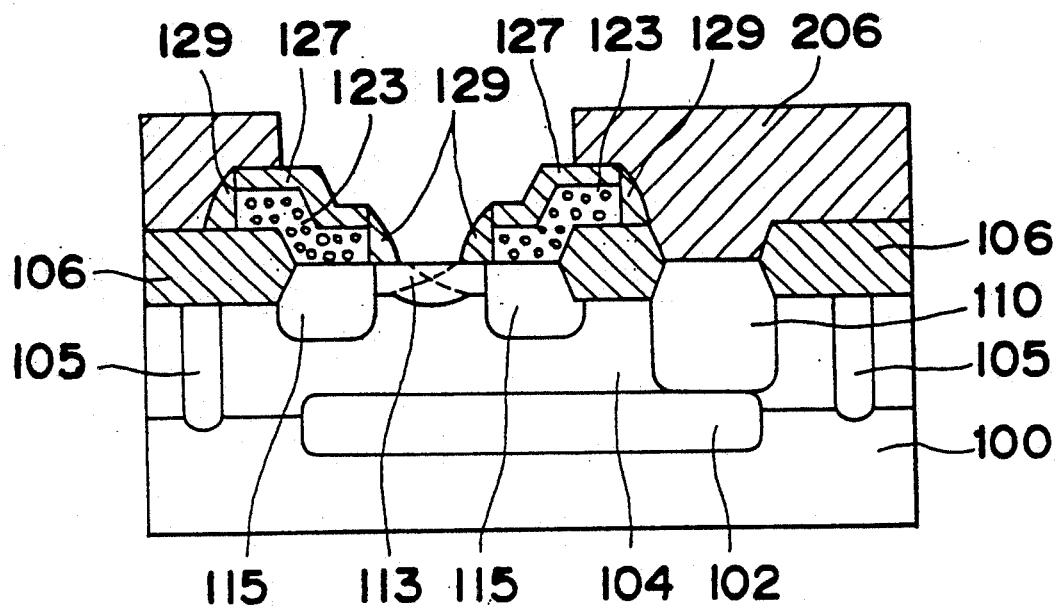
FIG. 10 shows a cross-sectional view of a major portion of a bipolar transistor obtained at the fourth step of a method for manufacturing a bipolar semiconductor device according to the second embodiment of the present invention.

In a step shown in FIG. 10, a resist pattern 206 is formed by a photo mask technology. The epitaxial semiconductor layer 104 has boron ions in a dose amount of 1 to $3 \times 10^{12}$ cm$^{-2}$ implanted therein at an acceleration energy of 15 keV from a direction inclined by about 25 degrees and has a link base region 113 to be an internal base region formed therein. It is noted that this link base region 113 is to connect an opening with the graft base region 115, that is, to connect between the graft base region 115 and an active base region to be formed later.

Figure 11:
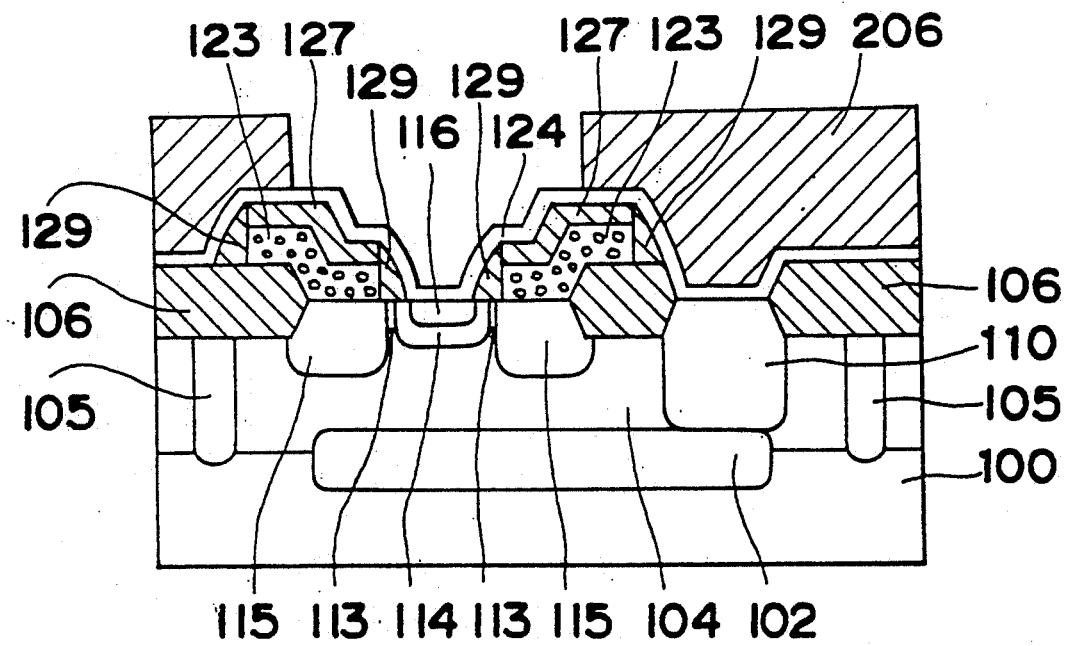
FIG. 11 shows a cross-sectional view of a major portion of a bipolar transistor obtained at the fifth step of a method for manufacturing a bipolar semiconductor device according to the second embodiment of the present invention.

As shown in FIG. 11, the next step in a similar way to that of the first embodiment is to deposit a silicon thin film (the first semiconductor thin film) in a thickness of about 30 nano meter composed of, for example, poly crystal silicon on the surface having the resist pattern removed therefrom. Then, an n-type emitter region 116 (a second semiconductor region) at a junction depth of about 180 nano meter is formed by implanting arsenic ions in a dose amount of 1 to $3 \times 10^{15}$ cm$^{-2}$ with an ion implantation process under an acceleration energy of 60 to 80 kev through the silicon thin film 124. Further, the ion implantation process forms a p-type active base region (a third semiconductor region) 114 by implanting boron in a dose amount of 1 to $3 \times 10^{13}$ cm$^{-2}$ through the silicon thin film 124 at an acceleration energy of 40 to 50 keV.

Figure 12:
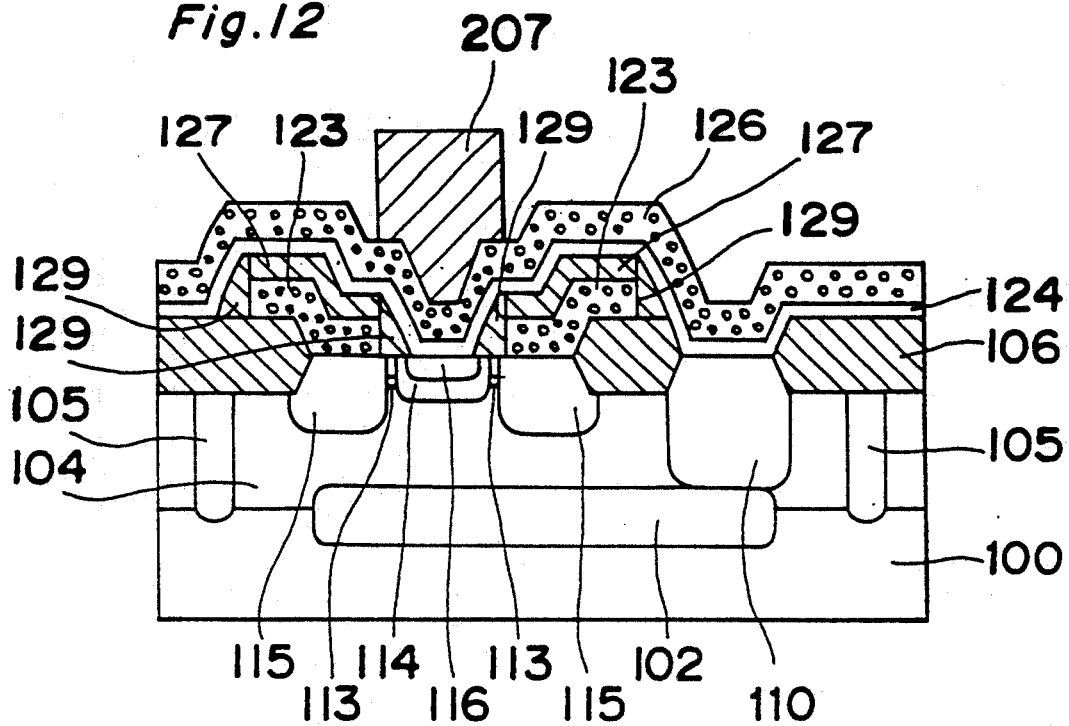
FIG. 12 shows a cross-sectional view of a major portion of a bipolar transistor obtained at the sixth step of a method for manufacturing a bipolar semiconductor device according to the second embodiment of the present invention.

Next, as shown in FIG. 12, the silicon thin film 124 has a poly silicon thin film 126 in a thickness of about 300 nano meter (a second semiconductor thin film) formed thereon in a similar way to that of the first embodiment. The poly silicon thin film 126 has the arsenic ions in a dose amount of $1 \times 10^{15}$ cm$^{-2}$ implanted thereunto at an acceleration energy of 40 keV. Then, a resist pattern 203 is formed through a photo-mask process. After that, an electrode for connecting the emitter is formed by carrying out an isotropic etching of the poly silicon crystal using the resist pattern as a mask.

Figure 13:
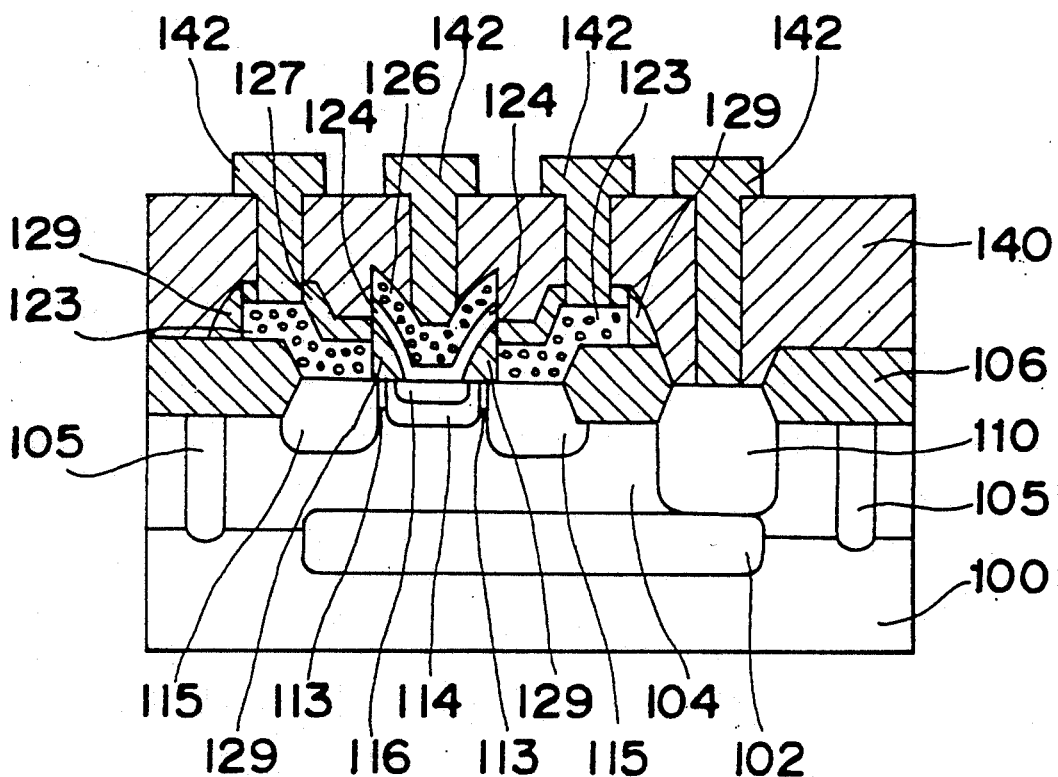
FIG. 13 shows a cross-sectional view of a major portion of a bipolar transistor obtained at the final step of a method for manufacturing a bipolar semiconductor device according to the second embodiment of the present invention.

A final step shown in FIG. 13 is to deposit, on all of the surface available, a BPSG film 140 for use as a protecting film in a similar way to that of the first embodiment. The BPSG film 140 is made flat by a heat treatment and is provided with contact windows for forming an electric circuit of emitter, collector and base.

In such a way, the emitter region 116 and the base region 114 can be formed by implanting directly arsenic ions and boron ions through the silicon thin film 124. It is possible to obtain a bipolar transistor having a high speed response by applying this method for the double poly silicon self-alignment emitter technology. In addition, a link base region 117 is formed at a position beneath the side-wall silicon oxide film 129 by an implantation of boron ions in an inclined direction when the link base region for linking between the active base region 114 and the graft base region 115 is formed.

Referring now to FIGS. 14 to 20, the description will be directed to a third embodiment wherein a bipolar transistor of an npn type is prepared by using a method for manufacturing a bipolar semiconductor device according to the present invention. The third embodiment of the present invention is the second case in which a method for manufacturing a bipolar semiconductor device according to the present invention is applied for a technology for double poly silicon self-alignment emitter. FIGS. 14 to 20 are cross-sectional views of npn-type bipolar transistors obtained at various steps of a method for manufacturing a bipolar semiconductor device according to the present invention.

Figure 14:
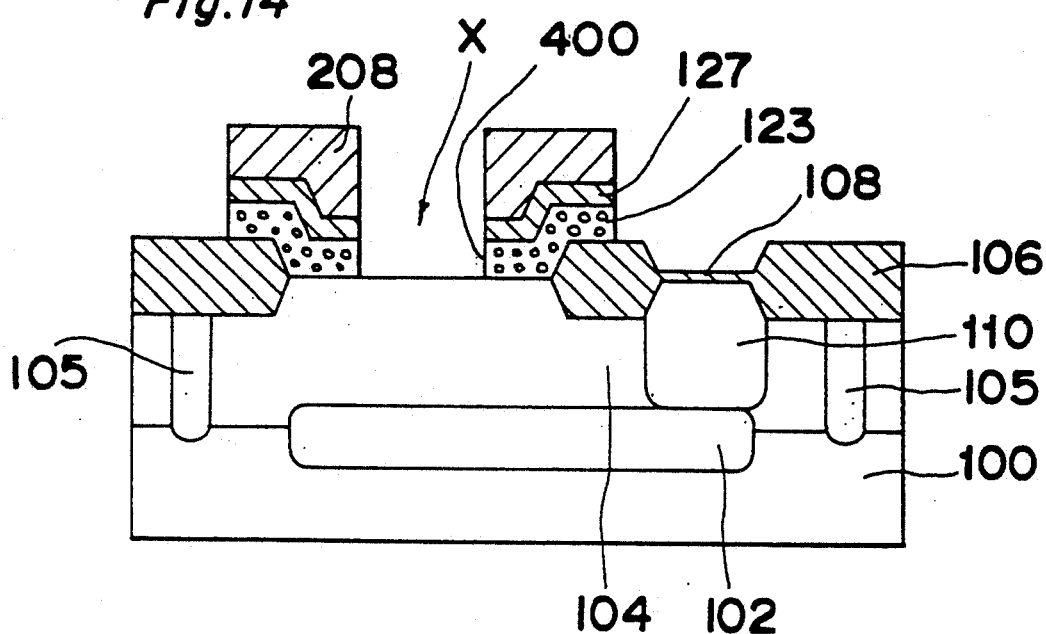
FIG. 14 shows a cross-sectional view of a major portion of a bipolar transistor obtained at the first step of a method for manufacturing a bipolar semiconductor device according to the third embodiment of the present invention.

Referring to FIG. 14, a p-type silicon semiconductor substrate 100 first has an n+ buried layer 102, a p-type buried layer 105 acting as a channel stopper for separating electrically elements from each other and an n-type epitaxial semiconductor layer 104 in a given thickness acting as a first semiconductor region formed thereon in a similar way to that of the first embodiment. An element separation oxide film 106 of a given thickness is formed on the surface of the semiconductor layer 104 by a LOCOS method (local oxidization method). Further, the epitaxial semiconductor thin film 104 has a thin silicon oxide film which has a thickness of 30 nano meter and which is to be an implantation protecting film 108 and subsequently a collector wall diffusion layer 110 formed thereon. After formation of a resist pattern (not shown in the drawing), a selective etching carried out by use of the resist pattern removes the implantation protecting oxide film 108 above a region x for base and emitter.

A next step shown in FIG. 14 is to deposit a poly silicon thin film 123 to be an electrode for leading-out a base on the surface after removal of the resist pattern. The poly silicon thin film 123 has born ions in a dose amount of 1 to $3 \times 10^{15}$ cm$^{-2}$ implanted with an acceleration energy of 40 to 50 keV thereunto. The ion implantation process forms a poly silicon to silicon oxide film 127 acting as a first insulating film on the surface of the poly silicon thin film 123. The surface of the poly silicon to silicon oxide film 127 has a resist pattern 208 for use in a formation of a base electrode formed thereon by a photo mask technology. After that, an opening 400 is formed by etching selectively the poly silicon to silicon oxide film 127 and the poly silicon thin film 123. It is noted that the poly silicon to silicon oxide film 127 acts as a layer to layer insulating film between the poly silicon thin film 123 and a poly silicon thin film for use in an electrode for leading-out an emitter to be formed later.

Figure 15:
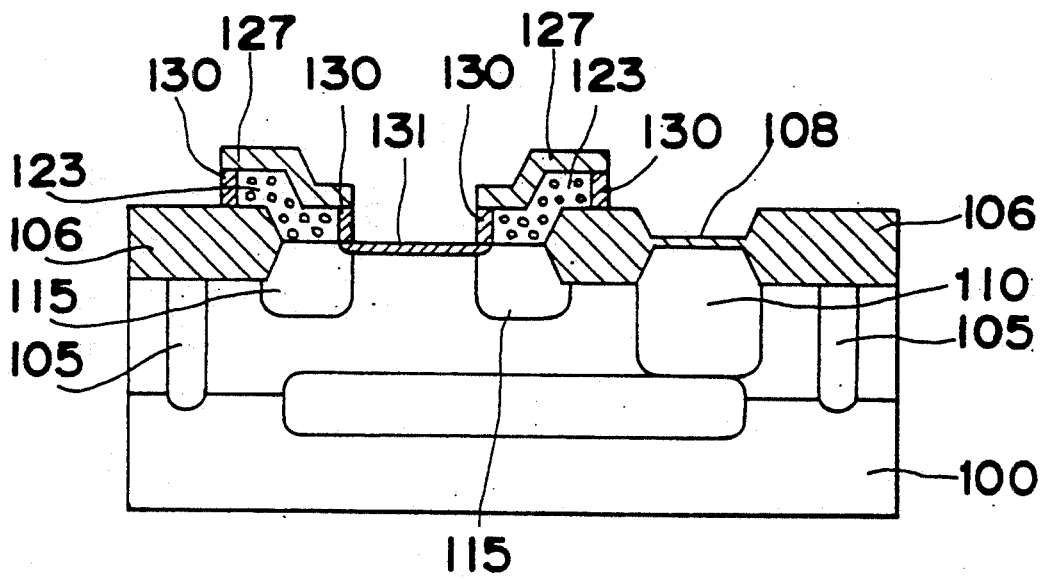
FIG. 15 shows a cross-sectional view of a major portion of a bipolar transistor obtained at the second step of a method for manufacturing a bipolar semiconductor device according to the third embodiment of the present invention.

As shown in FIG. 15, the surface having the opening 400 formed thereon, that is, the surface of the epitaxial semiconductor 104 is thermally oxidized after removal of the resist pattern 208. This thermal oxidizing process results in the formation of an implantation protecting film 131 to be a third insulating film and the formation of a side-wall oxide film 130 to be a second insulating film positioned at the side of the poly silicon thin film 123. Further, during the thermal oxidizing process shown in FIG. 14, the boron ions implanted into the poly silicon thin film 123 diffuse to form a graft base region 115.

Figure 16:
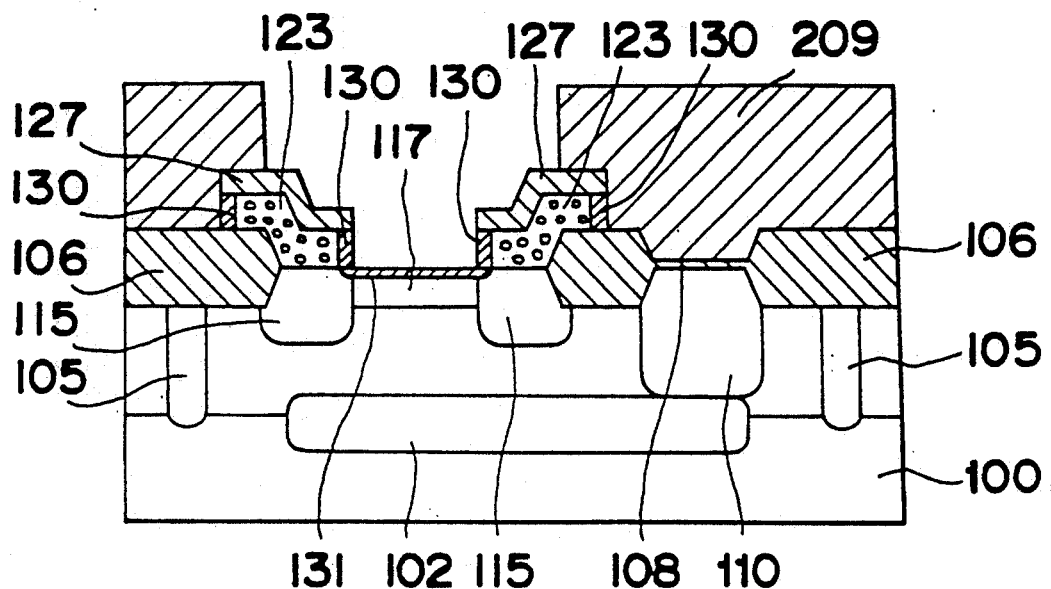
FIG. 16 shows a cross-sectional view of a major portion of a bipolar transistor obtained at the third step of a method for manufacturing a bipolar semiconductor device according to the third embodiment of the present invention.

The next step shown in FIG. 16 is first to form a resist pattern 209 and then to form a p-type link base region 117 by implanting boron ions in a dose amount of 1 to $3 \times 10^{12}$ cm$^{-2}$ through an implantation protecting film 131 positioned over the base emitter formation region x at a low acceleration energy of 15 keV by use of the resist pattern 209 acting as a mask. This link base region 117 is to connect between the graft base region 115 and an active base region to be formed later.

Figure 17:
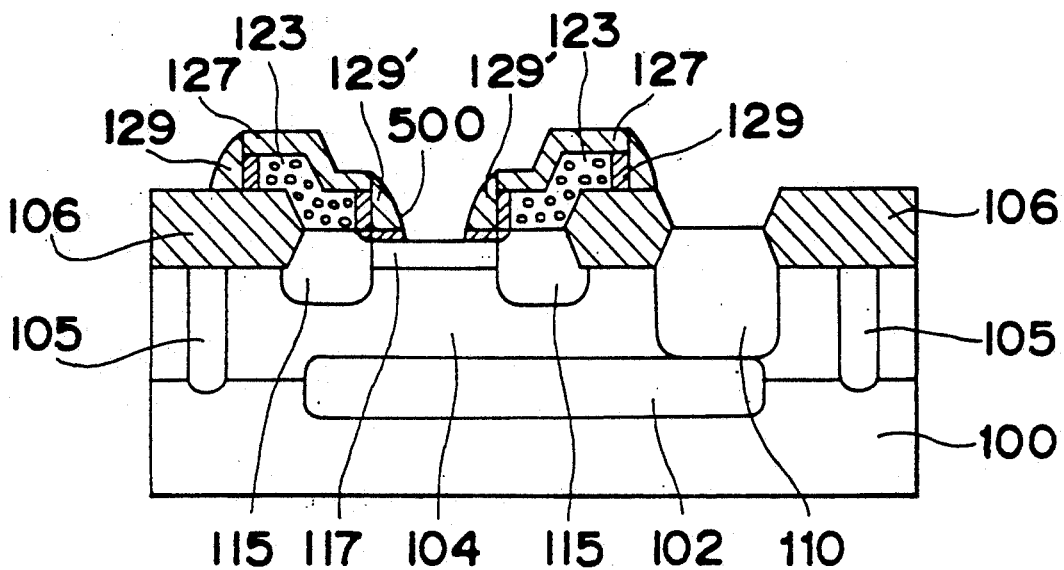
FIG. 17 shows a cross-sectional view of a major portion of a bipolar transistor obtained at the fourth step of a method for manufacturing a bipolar semiconductor device according to the third embodiment of the present invention.

The next step shown in FIG. 17 is to deposit the silicon oxide film all over the surface. The subsequent anisotropic etching causes the silicon oxide film to form a pattern to leave the silicon oxide film at the side wall of the poly silicon to silicon oxide film 127 and the side-wall heat oxidizing poly silicon thin film 130, which is referred to as a side-wall silicon oxide film 129 to be a fourth insulating film. The side-wall silicon oxide film 129 left at the side wall of the poly silicon thin film 123 causes an opening 500 positioned over a region x for the formation of an emitter smaller than an opening 400 formed by the resist pattern 208 shown in FIG. 14, and accordingly causes the size of the emitter to be lower in a self-adjusting way. In a manufacturing step shown in FIG. 14, boron ions implanted into the poly silicon thin film 123 diffuse into the poly silicon to silicon oxide film 127 and the side-wall silicon oxide film 129. The subsequent step for the heat treatment causes the boron ions in the poly silicon thin film 123 to move out from the poly silicon thin film 123 to form finally a graft base region 115 as shown in FIG. 17.

Figure 18:
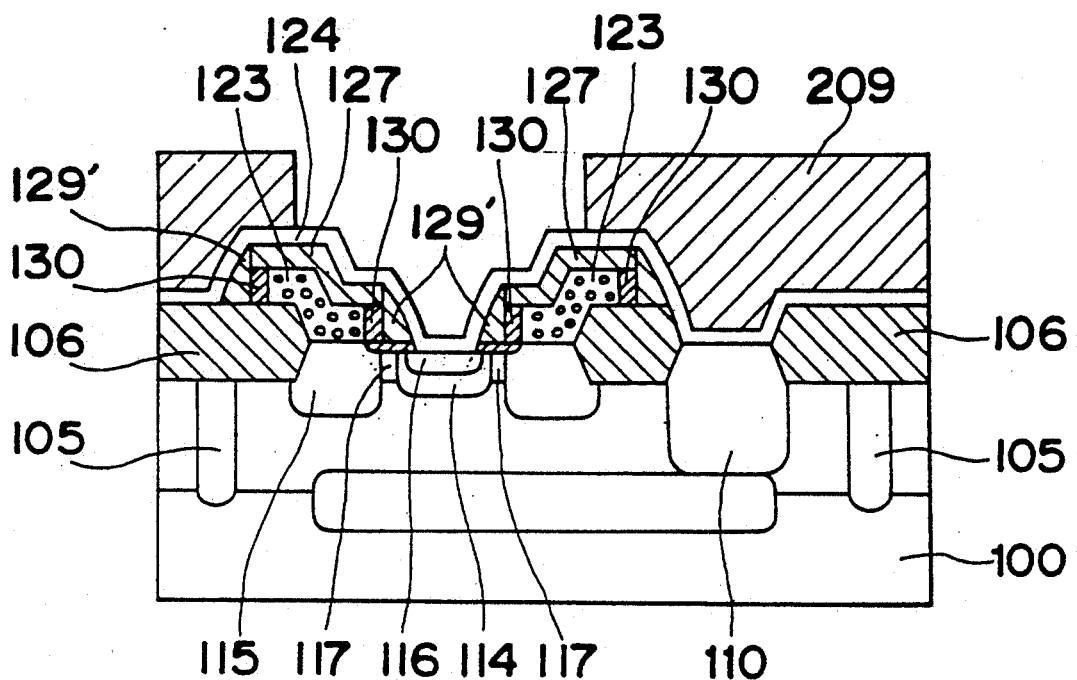
FIG. 18 shows a cross-sectional view of a major portion of a bipolar transistor obtained at the fifth step of a method for manufacturing a bipolar semiconductor device according to the third embodiment of the present invention.

As shown in FIG. 18, the next step in a similar way to that of the first embodiment is to deposit a silicon thin film (the first semiconductor thin film) of a thickness of about 30 nano meter on the surface having the resist pattern removed therefrom. Then, an n-type emitter region 116 (a second semiconductor region) having a junction depth of about 180 nano meter is formed by implanting arsenic ions in a dose amount of 1 to $3 \times 10^{15}$ cm$^{-2}$ with an ion implantation process under an acceleration energy of 60 to 80 keV through the silicon thin film 124. Further, the subsequent ion implantation process forms a p-type active base region (a third semiconductor region) 114 by implanting boron in a dose amount of 1 to $3 \times 10^{13}$ cm$^{-2}$ through the silicon thin film 124 at an acceleration energy of 40 to 50 keV.

Figure 19:
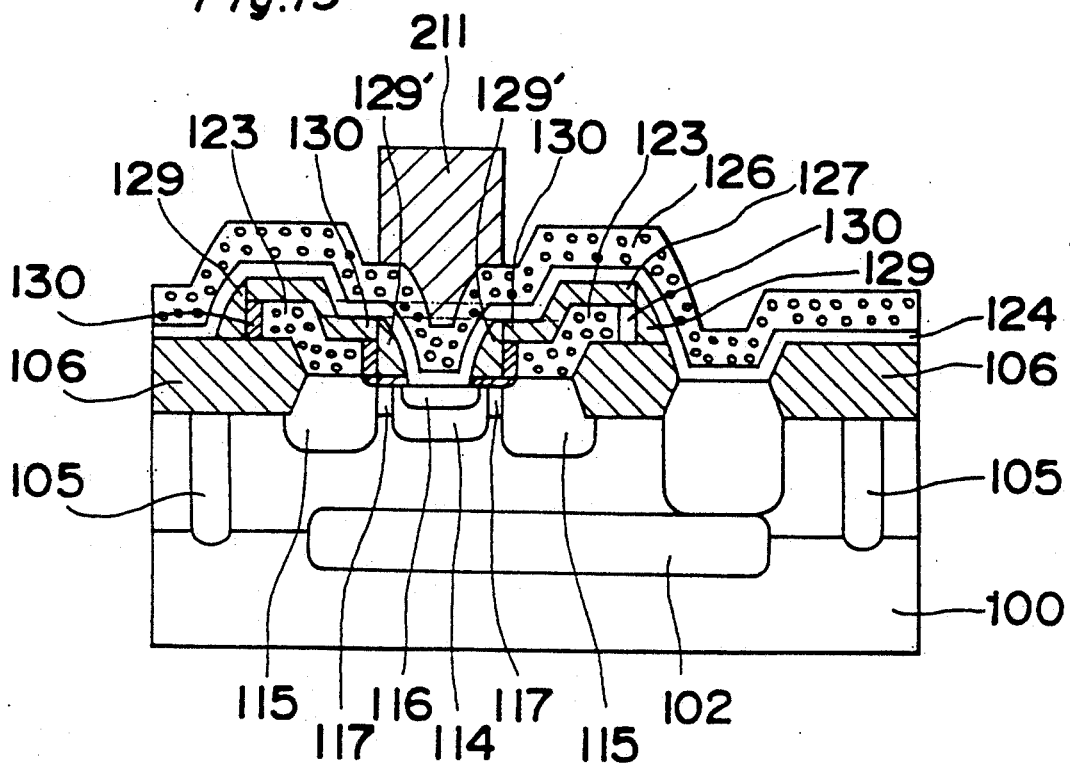
FIG. 19 shows a cross-sectional view of a major portion of a bipolar transistor obtained at the sixth step of a method for manufacturing a bipolar semiconductor device according to the third embodiment of the present invention.

Next, as shown in FIG. 19, the silicon thin film 124 has a poly silicon thin film 126 at a thickness of about 300 nano meter (a second semiconductor thin film) formed thereon in a similar way to that of the first embodiment. The poly silicon thin film 126 has the arsenic ions in a dose amount of $1 \times 10^{15}$ cm$^{-2}$ implanted thereunto at an acceleration energy of 40 keV. Then, a resist pattern 211 is formed through a photo-mask process. After that, an electrode for connecting the emitter is formed by carrying out an isotropic etching of the silicon thin film 126 using the resist pattern 211 acting as a mask.

Figure 20:
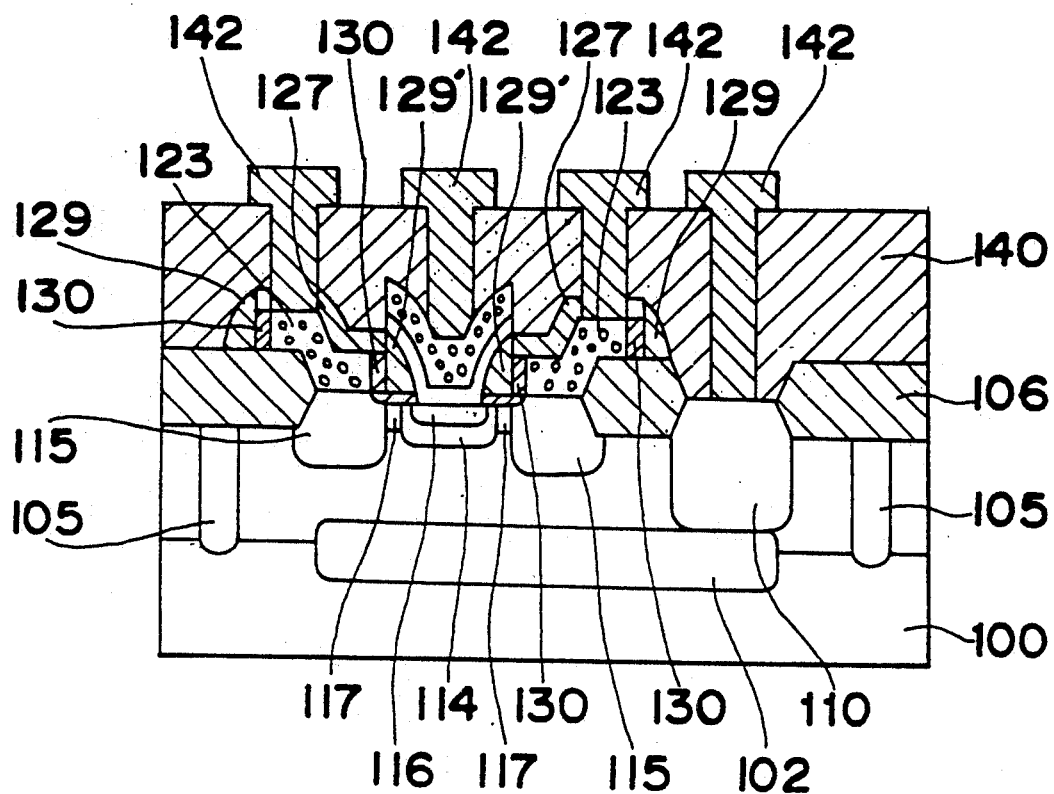
FIG. 20 shows a cross-sectional view of a major portion of a bipolar transistor obtained at the final step of a method for manufacturing a bipolar semiconductor device according to the third embodiment of the present invention.

A final step shown in FIG. 20 is to deposit, on all of the surface available, a BPSG film 140 for use as a protecting film in a similar way to that of the first embodiment. The BPSG film 140 is made flat by a heat treatment and is provided with contact windows for forming an electric circuit of emitter, collector and base.

In such a way, the emitter region 116 and the base region 114 can be formed by implanting directly arsenic ions and boron ions through the silicon thin film 124. It is possible to obtain a bipolar transistor having a high speed response by applying this method for the double poly silicon self-alignment emitter technology. An implantation protecting film 131 is formed on the surface of the epitaxial semiconductor 104 to be a first semiconductor region in advance of the formation of the side-wall silicon oxide film 129' when the link base region for connecting the active base region 114 and the graft base region 115 is formed. The ion implantation of boron ions through the implantation protecting film 131 permits the link base region 117 to be formed at a position beneath the side-wall silicon oxide film 129' without making the surface of the epitaxial semiconductor 104 rough.

Figure 37:
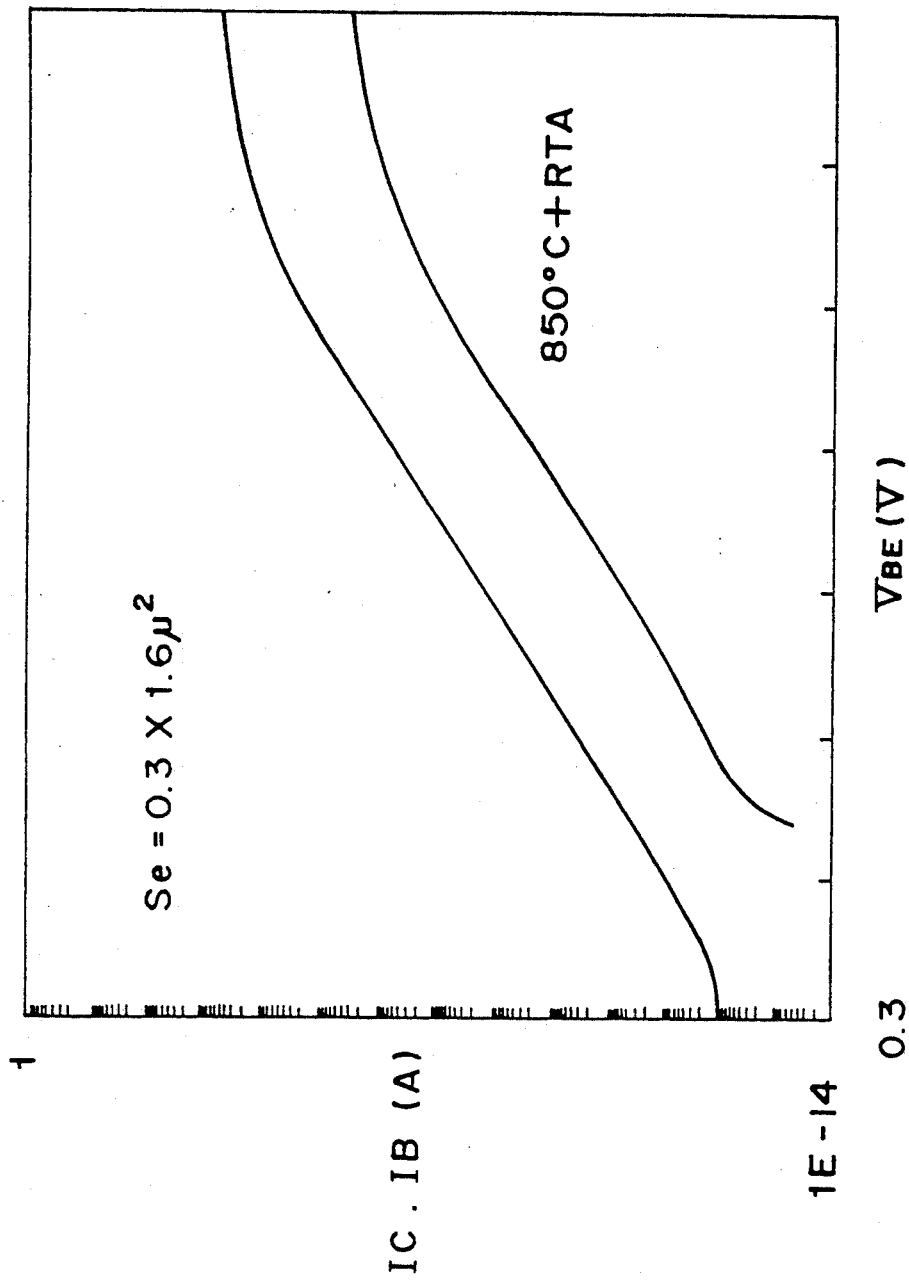
FIG. 37 shows the Gummel characteristic of the npn transistor manufactured according to the third preferred embodiment of the present invention.
Figure 38:
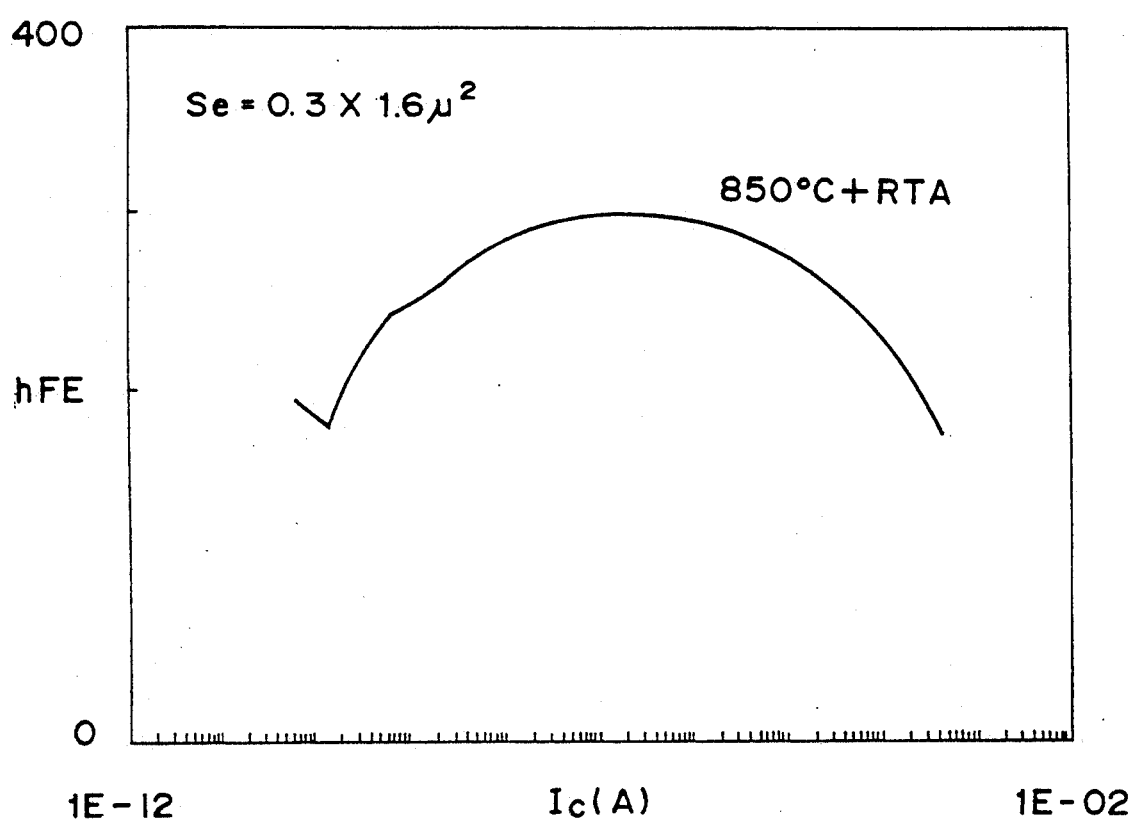
FIG. 38 shows the variation of the current amplification factor $h_{FE}$ of the npn transistor manufactured according to the third preferred embodiment of the present invention as dependent on the collector current Ic.

FIG. 37 shows a Gummel characteristic of the npn transistor manufactured according to the third preferred embodiment of the present invention, and FIG. 38 shows the variation of the current amplification factor $h_{FE}$ of the same as dependent on the collector current Ic. Although the emitter size is as small as 0.3 μm×1.6 μm, no leakage current is observed in the low current range and the current amplification factor $h_{FE}$ maintains a high value ranging from 200 to 300 over a wide range of the collector current.

Further, table 1 shows parameters of the npn transistor according to the third preferred embodiment in comparison of those of the npn transistor according to the third conventional method.

TABLE 1

|  | Conventional method (3) | 3-rd preferred embodiment |
|---|---|---|
| Se | 1 × 2 | 0.3 × 1.6 μm² |
| $h_{FE}$ | 184 | 162 |
| BVceo | 6.6 V | 7.6 V |
| BVebo | 5.6 V | 5.6 V |
| Ceb | 6.5 fF | 4.9 fF |
| Ccb | 16.1 fF | 11.7 fF |
| fTmax | 10.2 GHz | 20.0 GHz |
| base width | 320 nm | 250 nm |
| Heat treatment | 850° C. + RTA | 850° C. + RTA |

Se: Emitter size
$h_{FE}$: Current gain
BVceo: Collector-emitter breakdown voltage
BVebo: Emitter-base breakdown voltage
Ceb: Emitter-base spacecharge layer capacitance
Ccb: Collector-base spacecharge layer capacitance
Ftmax: Maximum collector cut-off frequency As is apparent from Table 1, according to the third preferred embodiment, the base width can be made smaller and the capacitance can be reduced although the heat treatment temperature is the same as that of the conventional method.

Thereby the maximum collector cut-off frequency Ftmax can be increased up to 20 Ghz and high performance can be realized. Also, as is understood from FIG. 36 showing an impurity profile, since the concentration of boron at the active base region is maintained at a high value, $h_{FE}$ is kept substantially the same as that of the conventional one and the breakdown voltage is not lowered although the base width is decreased.

Further, it is to be noted that the dispersion of $h_{FE}$ in a wafer plane is not increased and, therefore, the yield of LSI can be kept at a reasonable value even if the emitter window area is reduced from 1.2 μm² to 0.6 μm² in the case of the npn transistor according to the present preferred embodiment wherein both the emitter region and the active base region are formed by implanting ions through semiconductor thin film. In contrast to this, the dispersion of the $h_{FE}$ in a wafer plane is increased up to 1.5 times when the emitter window area is reduced from 4 pm² to 2 pm² in the case of the conventional method wherein only the emitter region is formed by implanting ions through a semiconductor thin film.

Figure 39:
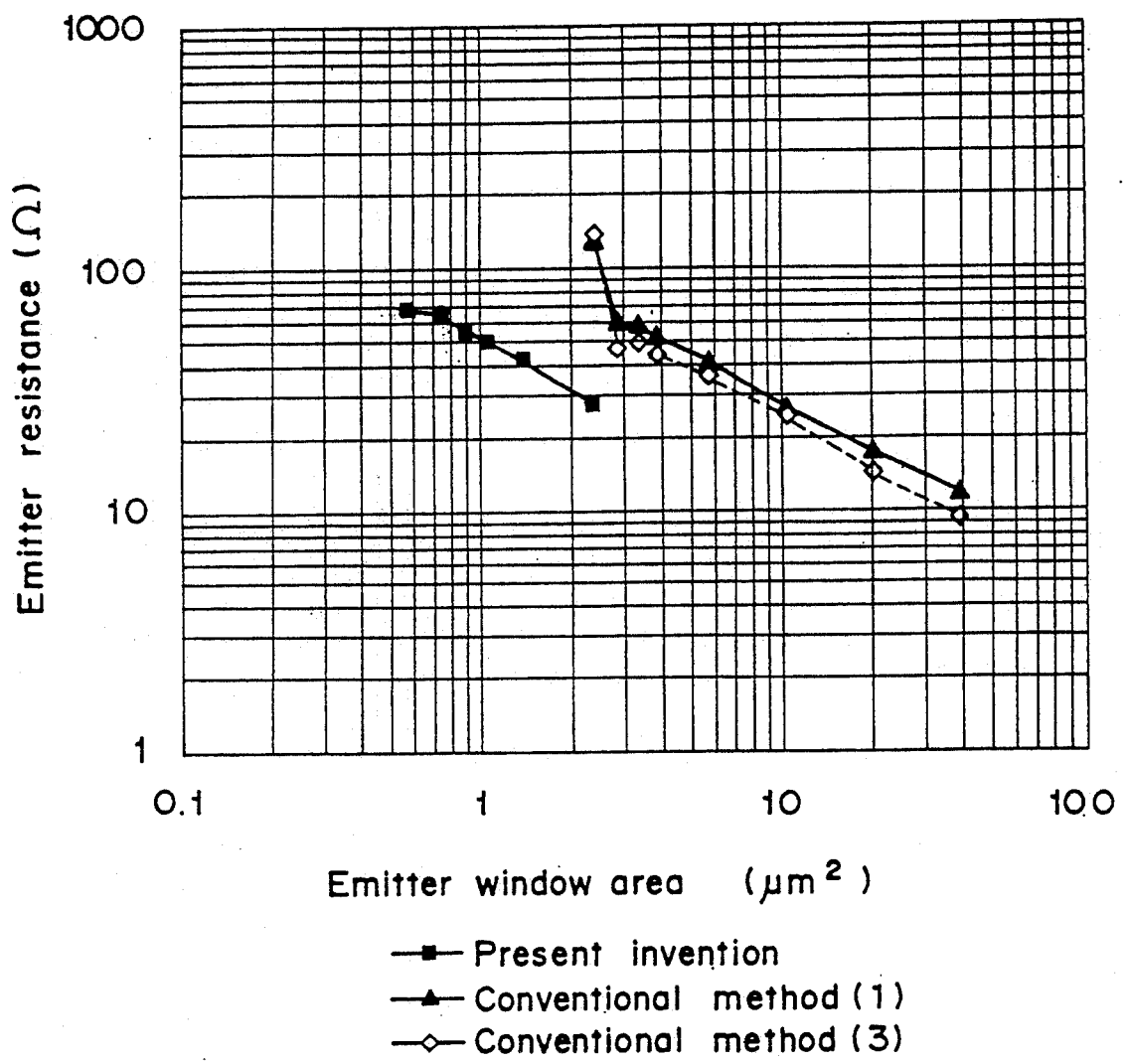
FIG. 39 shows the dependency of the emitter resistance on the emitter window area with respect to the npn transistors manufactured according to the conventional methods (1) and (3) and the third preferred embodiment of the present invention.

FIG. 39 shows dependency of the emitter resistance on the emitter window area with respect to the npn transistors manufactured according to the conventional methods (1) and (3) and the third preferred embodiment of the present invention. As is apparent therefrom, the conventional npn transistors can not exhibit a desirable transistor characteristic since the emitter resistance becomes high due to the native oxide film when the emitter window area is decreased to about 2 μm² while, according to the third preferred embodiment of the present invention, it is possible to form the emitter region and the active base region without receiving affection due to miniaturization of the emitter window to about 0.6 pm² by reducing the affection due to the native oxide film.

It is noted that the first semiconductor comprises a silicon thin film 124 composed of poly silicon but may comprise an amorphous semiconductor such as amorphous silicon. Use of amorphous silicon can prevent so called channeling occurring at an implantation of arsenic ions for formation of an emitter and accordingly can form an emitter having uniform depth.

The implantation order can start with either of arsenic or boron. The implementation with arsenic first causes the area having arsenic ions implanted therein to be in an amorphous state. The implantation of boron second prevents the channeling and can form a base region having a uniform depth.

Figure 40:
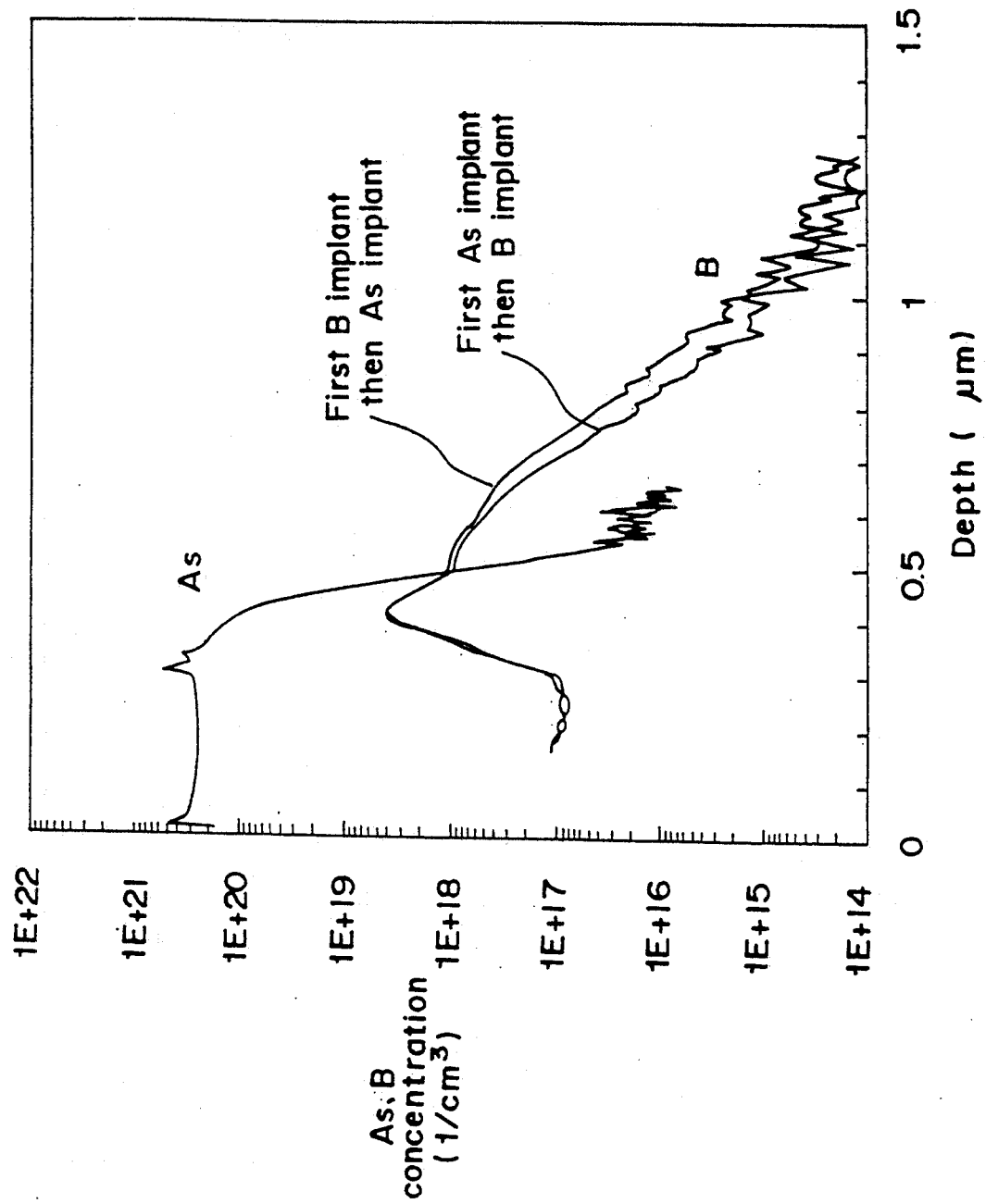
FIG. 40 shows a graph of SIMS profile indicating the relationship between an implantation depth and an impurity concentration of arsenic ions and boron ions as a function of the implantation order of arsenic ions and boron ions.

FIG. 40 shows SIMS profile of As and B according to the formation method of the present invention for the emitter and the active base which is indicated from the surface of the poly silicon thin film 126 as the second semiconductor region having a thickness of about 300 nano meter. Ion implant conditions to the emitter and active base regions are: dose amount $2 \times 10^{15}$ cm$^{-2}$, acceleration energy 70 KeV for As and dose amount $4 \times 10^{13}$ cm$^{-2}$, acceleration energy 40 keV for B; heat and heat treatment conditions (850° C.; 30 min.) When As is implanted first, the region implanted becomes amorphous. This prevents channeling upon implanting B later and, therefore, the active base region 114 can be more narrowly formed.

Referring to FIGS. 21 to 26, the following description will be directed to a fourth embodiment of the present invention.

FIGS. 21 to 26 show cross-sectional views of major portions of a bipolar transistor obtained at various steps of a method for manufacturing a bipolar semiconductor device according to the fourth embodiment of the present invention.

Figure 21:
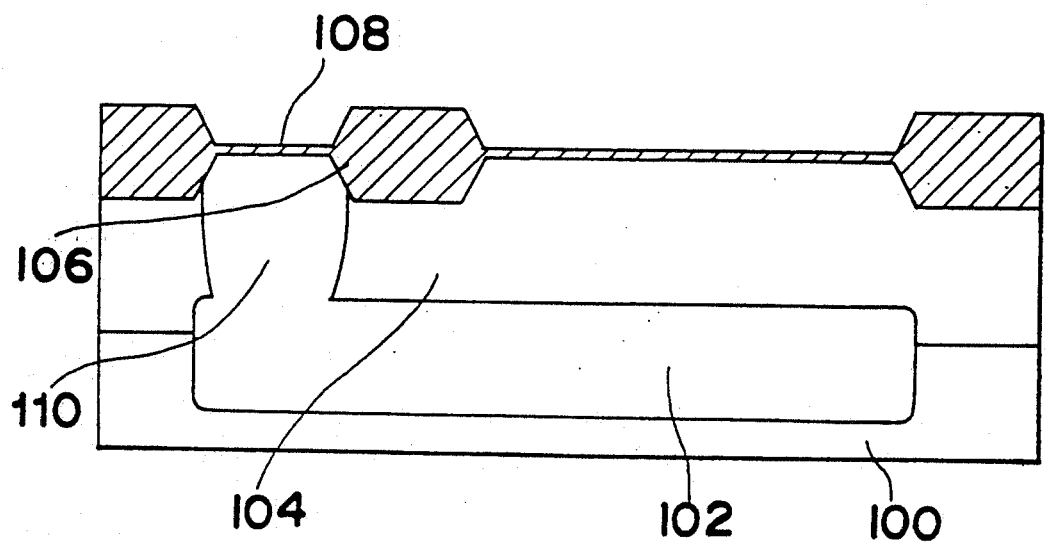
FIG. 21 shows a cross-sectional view of a major portion of a bipolar transistor obtained at the first step of a method for manufacturing a bipolar semiconductor device according to the fourth, fifth, sixth and seventh embodiments of the present invention.

First, an n-type buried semiconductor region 102 is formed on a p-type silicon single crystal substrate 100 having an electric resistance of 1 to 10 ohm/cm by implanting arsenic ions in a dose amount of $10^{14}$ to $10^{15}$cm$^{-2}$. An epitaxial growth results in the formation of an n-type semiconductor region 104 to be a first semiconductor region of a thickness of 1.3 micron. The surface of the epitaxial layer is thermally oxidized at the selected portion into a thickness of 500 nano meter by the LOCOS method to form an element separation film 106. Then, a silicon oxide film of a thickness of 30 nano meter is formed over all of the surface and is provided with an n-type semiconductor region 110 to be a collector wall by implanting phosphorous ions in a dose amount of $10^{15}$ to $10^{16}$cm$^{-2}$ using a resist pattern as a mask. (FIG. 21).

Figure 22:
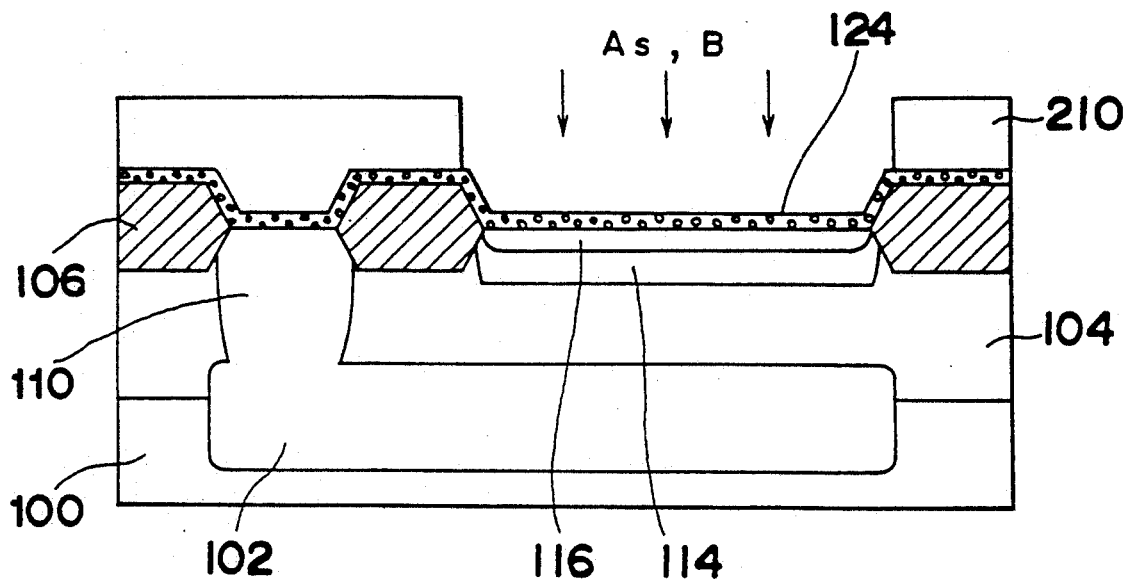
FIG. 22 shows a cross-sectional view of a major portion of a bipolar transistor obtained at the second step of a method for manufacturing a bipolar semiconductor device according to the fourth, fifth, sixth and seventh embodiments of the present invention.

A next step is to remove the silicon oxide film at an area to be an active region of a transistor, to deposit a silicon thin film 124 to be a first semiconductor thin film in a thickness of about 30 nano meter and to form an n-type semiconductor region 116 for use in the formation of an emitter by implanting arsenic ions in a dose amount of $10^{15}$ to $10^{16}$cm$^{-2}$ with an acceleration energy higher than that for the formation of the silicon thin film with a thickness of 30 nano meter. Further, a p-type semiconductor region 114 to be a second semiconductor region for a base is formed by implanting boron ions in a dose amount of $10^{13}$ to $10^{14}$cm$^{-2}$ with an acceleration energy higher than that for the formation of a silicon thin film with a thickness of 30 nano meter. (FIG. 22).

Figure 23:
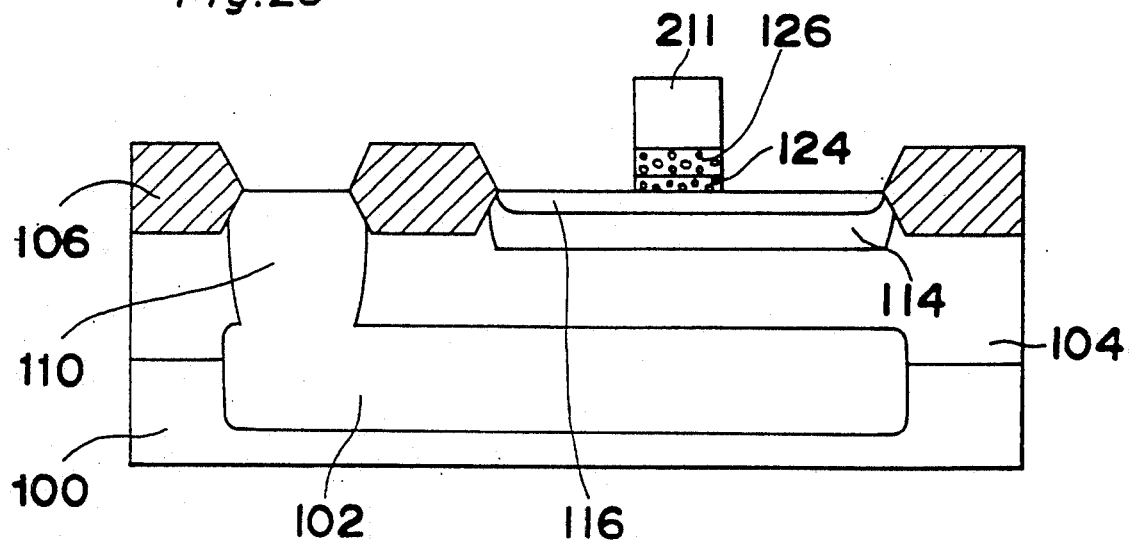
FIG. 23 shows a cross-sectional view of a major portion of a bipolar transistor obtained at the third step of a method for manufacturing a bipolar semiconductor device according to the fourth, fifth, sixth and seventh embodiments of the present invention.

A next step is to deposit a poly silicon thin film 126 to be a second semiconductor thin film of a thickness of 300 nano meter and to form an electrode for leading-out an emitter by implanting arsenic ions in a dose amount of $10^{15}$ to $10^{16}$ cm$^{-2}$ into the poly silicon film. Further, the poly silicon thin film is used as a resist pattern for the formation of an emitter electrode formed thereon. (FIG. 23)

It is not essential to form the second semiconductor thin film 126. However, it becomes possible to thicken the film for the emitter lead-out electrode. Further, by introducing As into the second semiconductor thin film 126, the barrier effect enabling the recombination of hole carriers moving from the second semiconductor region 116 to the emitter lead-out electrodes 124 and 126 at grain boundaries of poly silicon wherein As is contained at a high concentration and, thereby, it becomes possible to lower the base current and to increase the current amplification factor.

Figure 24:
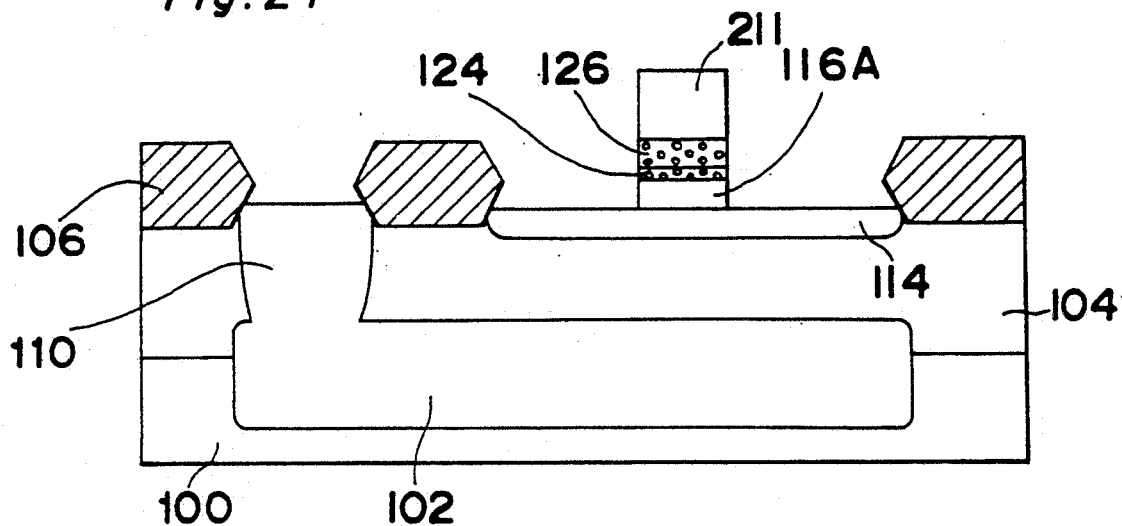
FIG. 24 shows a cross-sectional view of a major portion of a bipolar transistor obtained at the fourth step of a method for manufacturing a bipolar semiconductor device according to the fourth, fifth, sixth, and seventh embodiment of the present invention.

Next, an etching process is carried out in connection with an active area of the poly silicon thin film having the resist pattern formed thereon to remove a major part of the n-type semiconductor to be an external base region. A residual part of the n-type semiconductor is left at a position beneath the poly silicon electrode for the formation of an emitter (FIG. 24).

Figure 25:
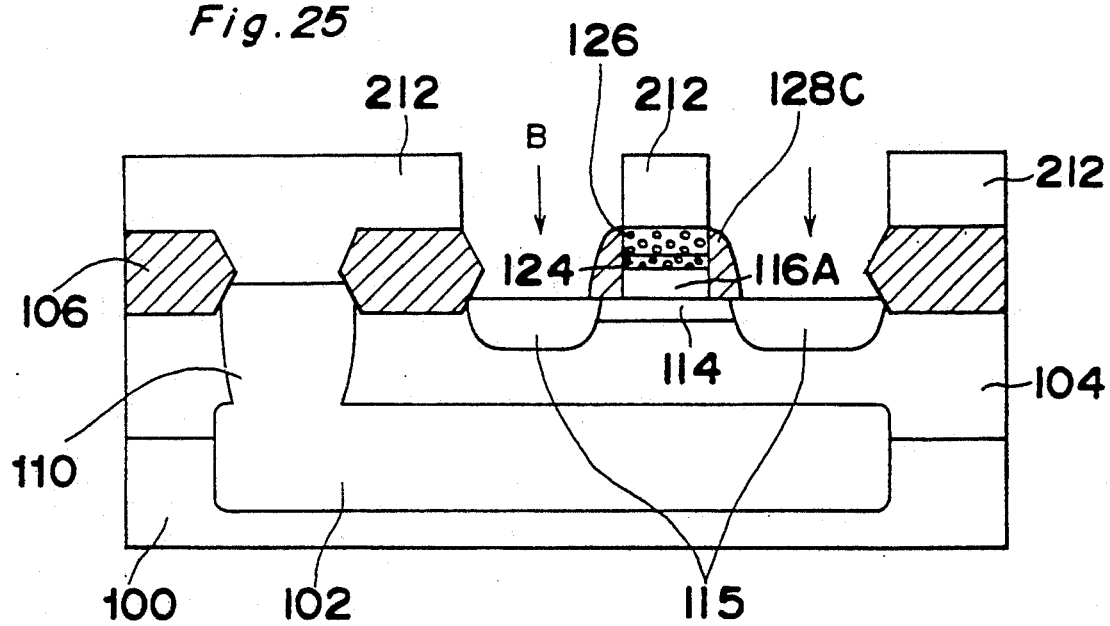
FIG. 25 shows a cross-sectional view of a major portion of a bipolar transistor obtained at the fifth step of a method for manufacturing a bipolar semiconductor device according to the fourth embodiment of the present invention.
Figure 26:
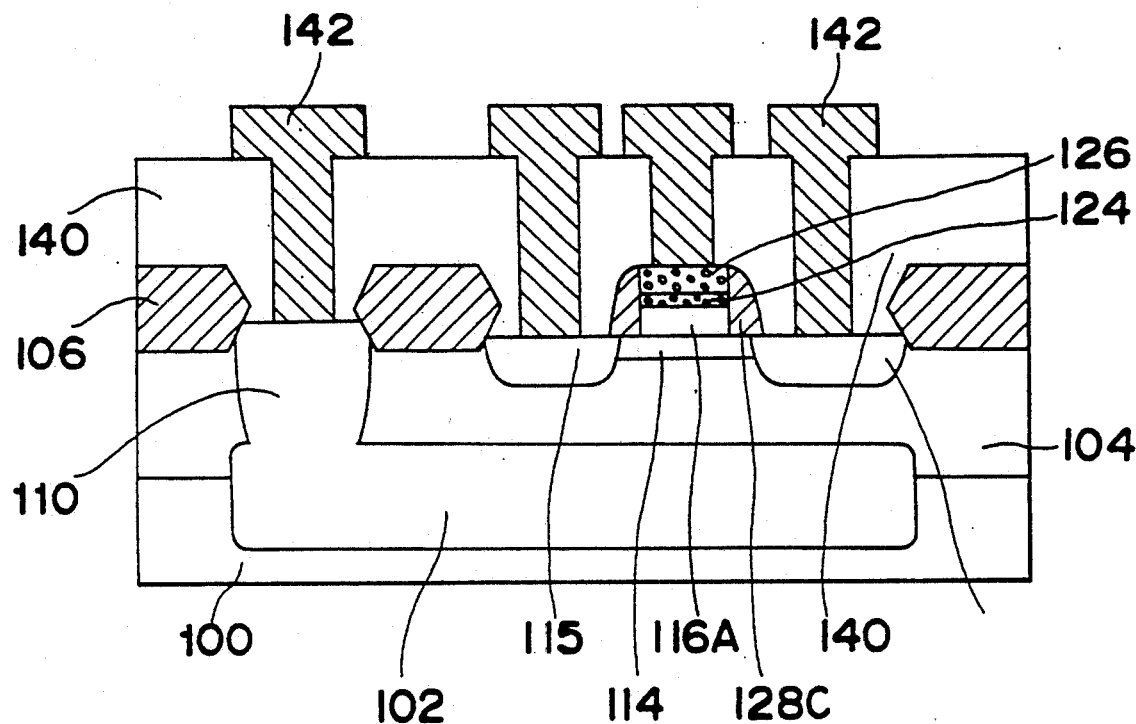
FIG. 26 shows a cross-sectional view of a major portion of a bipolar transistor obtained at the final step of a method for manufacturing a bipolar semiconductor device according to the fourth embodiment of the present invention.

A next step is to deposit a silicon oxide film in a thickness of, for example, 150 nano meter and to form a side-wall 128c through an isotropic etching process. Further, an implantation of boron ions in a dose amount of $10^{15}$ to $10^{16}$ cm$^{-2}$ generates a p-type semiconductor region 115 to be an external base region (FIG. 25).

A final step is to deposit an insulating film 140 such as a BPSG film on all of the surface and to make the insulating film flat by a heat treatment carried out at a temperature of, for example, 850° C. for 30 min. And then, a completion of each of wiring 142 results in a semiconductor device having a structure shown in FIG. 26.

Figure 27:
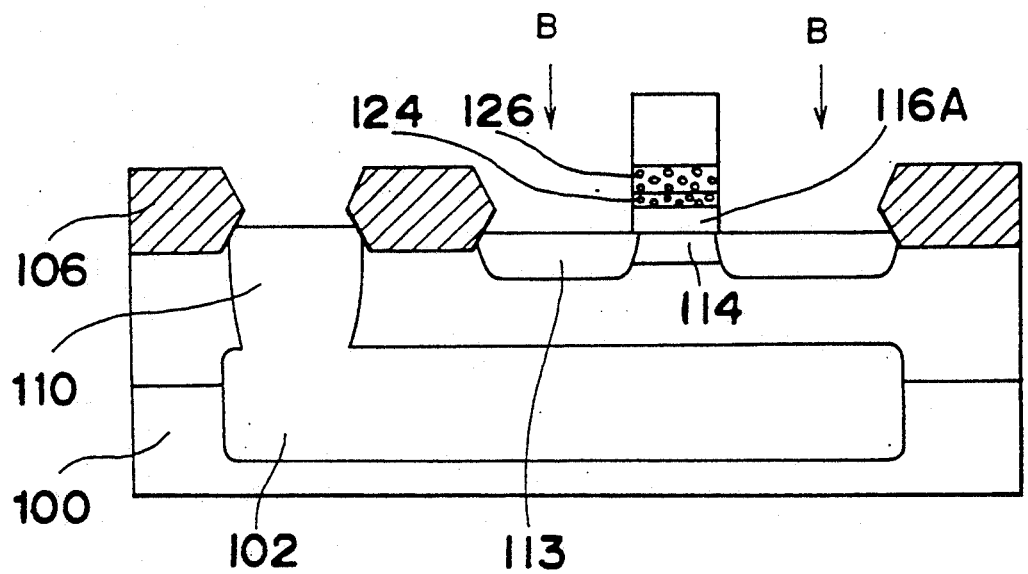
FIG. 27 shows a cross-sectional view of a major portion of a bipolar transistor obtained at the fifth step of a method for manufacturing a bipolar semiconductor device according to the fifth embodiment of the present invention.
Figure 28:
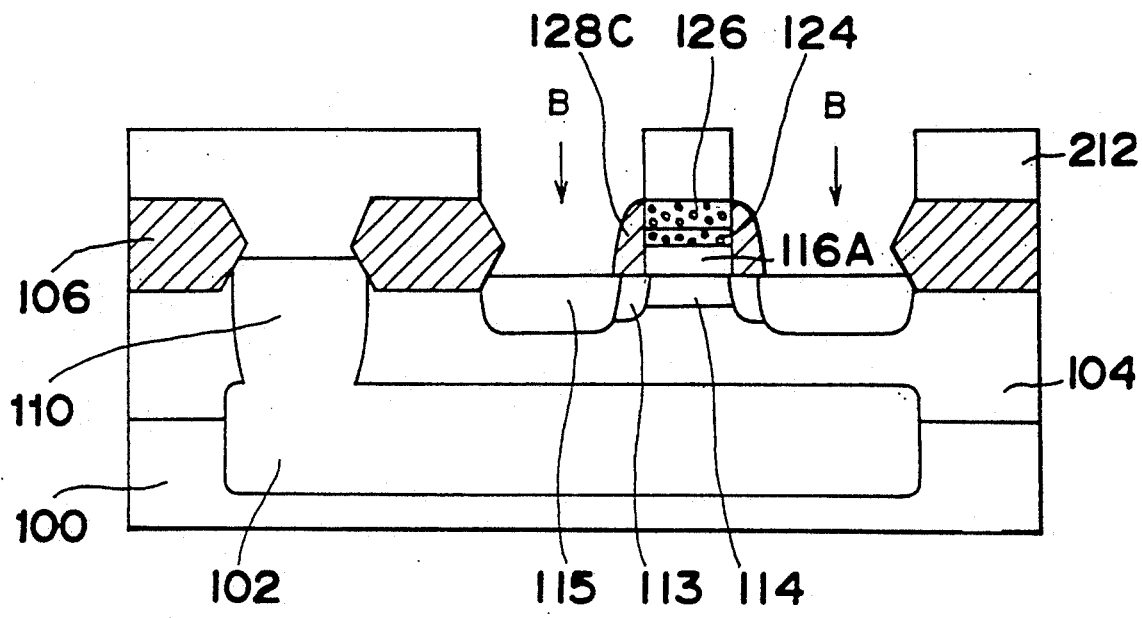
FIG. 28 shows a cross-sectional view of a major portion of a bipolar transistor obtained at the sixth step of a method for manufacturing a bipolar semiconductor device according to the fifth embodiment of the present invention.
Figure 29:
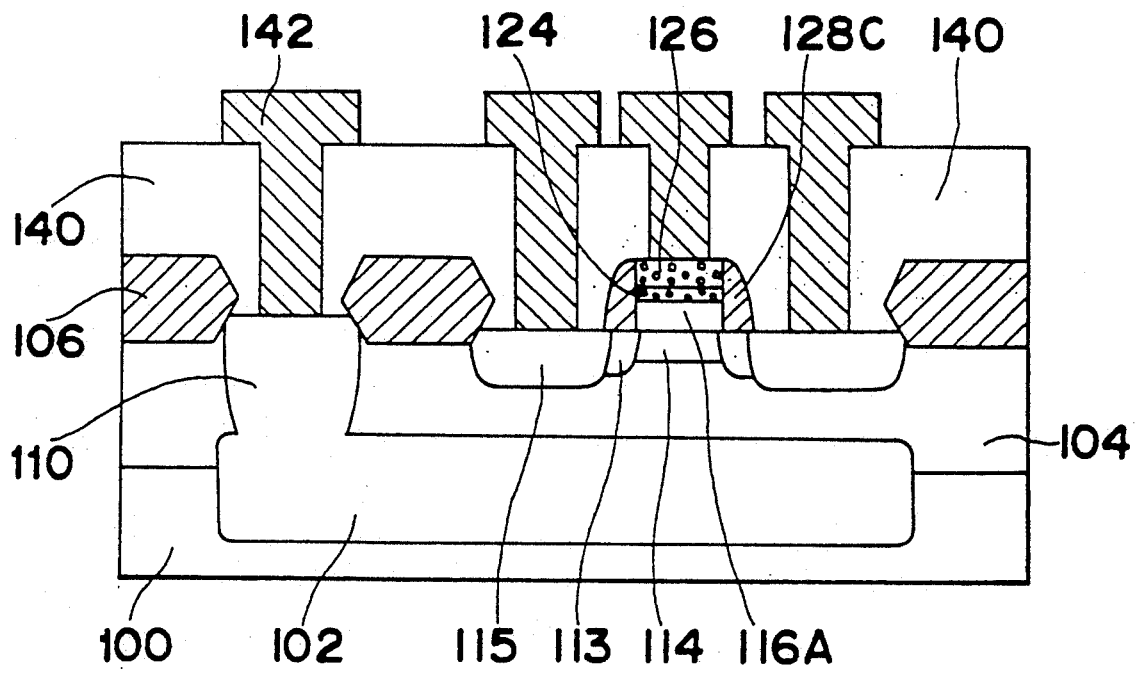
FIG. 29 shows a cross-sectional view of a major portion of a bipolar transistor obtained at the final step of a method for manufacturing a bipolar semiconductor device according to the fifth embodiment of the present invention.

Referring to FIGS. 27 to 29, the following description will be directed to a fifth embodiment of the present invention.

FIGS. 27 to 29 show cross-sectional views of major portions of bipolar transistors obtained at various steps of a method for manufacturing a bipolar semiconductor device according to the fifth embodiment of the present invention.

First, steps as shown in FIGS. 21 to 24 are performed as in the fourth preferred embodiment of the present invention.

Then, as shown in FIG. 27, a p-type semiconductor region 113 as a fifth semiconductor region being a link base region is formed so as to have an impurity concentration lower than that of the external base by implanting boron at a does amount of $10^{12}$ to $10^{14}$ cm$^{-2}$ using the resist pattern 211 as a mask. At this time, boron as an impurity of p-type is introduced also in the collector wall dispersion layer 110, but the characteristic thereof is hardly affected since the concentration of the n-type impurity introduced therein is higher than that of boron (about 100 times as high as that of the latter).

A next step is to deposit a silicon oxide film in a thickness of, for example, 150 nano meter and to form a side-wall 128c through an anisotropic etching process. Further, an implantation of boron ions in a does amount of $10^{15}$ to $10^{16}$ cm$^{-2}$ generates a p-type semiconductor region 115 of a fourth semiconductor region to be an external base region (FIG. 28).

A final step is to deposit a BPSG film 140 as a protection film on all of the surface and to make the insulating film flat by a heat treatment similarly to the first preferred embodiment and, after forming respective contract windows for emitter, collector and base on the BPSG film 140, a completion of each of wiring 142 results in a semiconductor device having a structure as shown in FIG. 29.

In such way, the ion implantation in the external base region after the formation of the side-wall generates, in a self-adjusting way, a link base region having a suitable impurity concentration and the profile before the formation of the side-wall. This permits the emitter region and the link base region to be suitably separated from each other and not to be brought into a contact with any impurity in a high concentration. Further, the connection between an intrinsic base and the external base is ensured through the link base. In such a way, a semiconductor device according to the manufacturing method of the present invention is greatly improved with respect to reliability.

Figure 30:
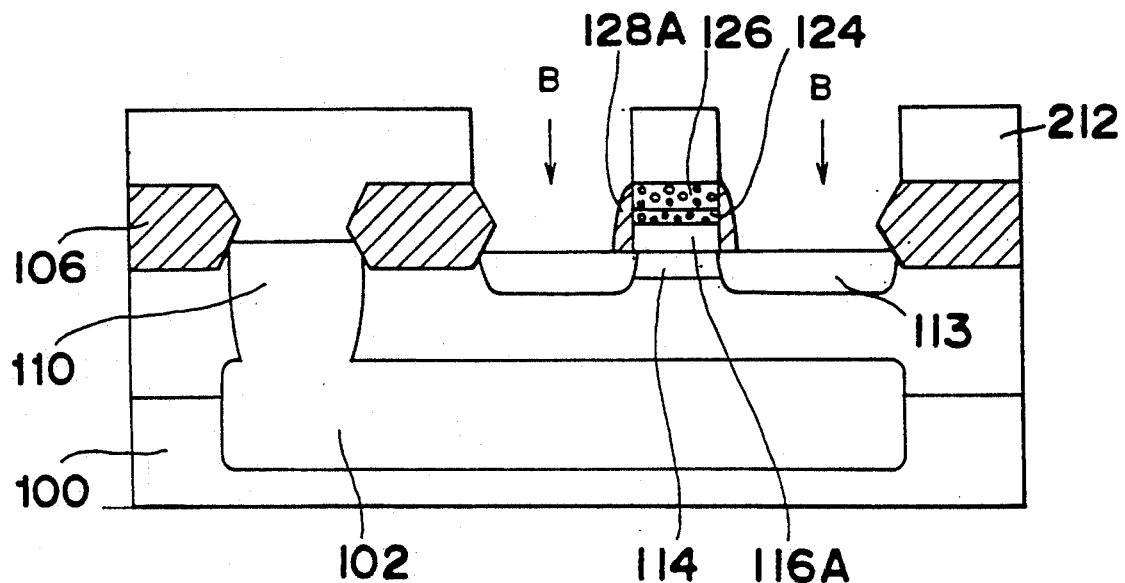
FIG. 30 shows a cross-sectional view of a major portion of a bipolar transistor obtained at the fifth step of a method for manufacturing a bipolar semiconductor device according to the sixth embodiment of the present invention.
Figure 31:
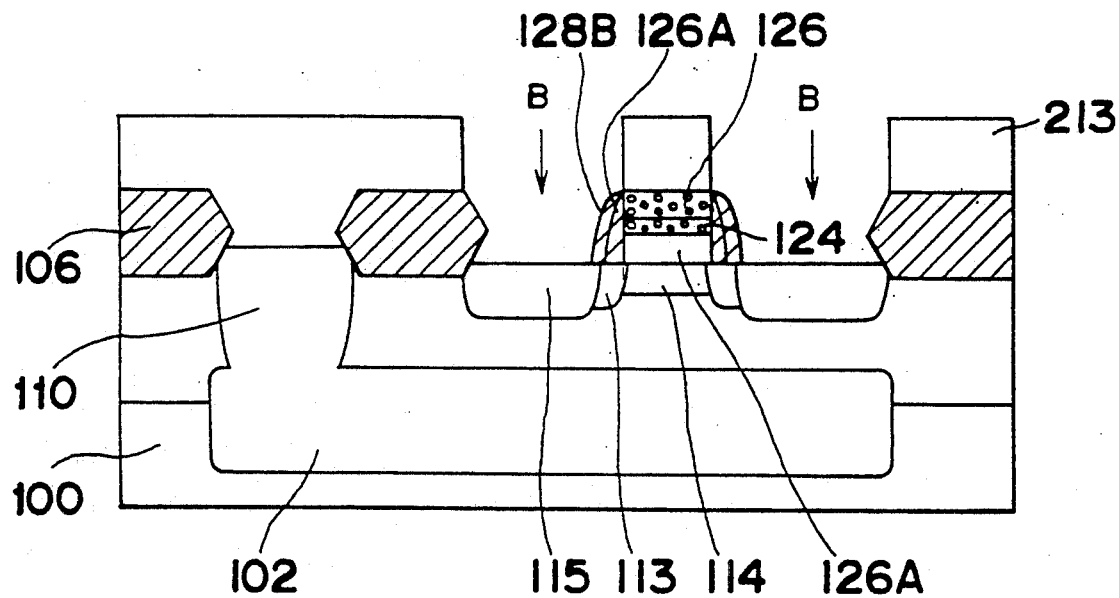
FIG. 31 shows a cross-sectional view of a major portion of a bipolar transistor obtained at the sixth step of a method for manufacturing a bipolar semiconductor device according to the sixth embodiment of the present invention.
Figure 32:
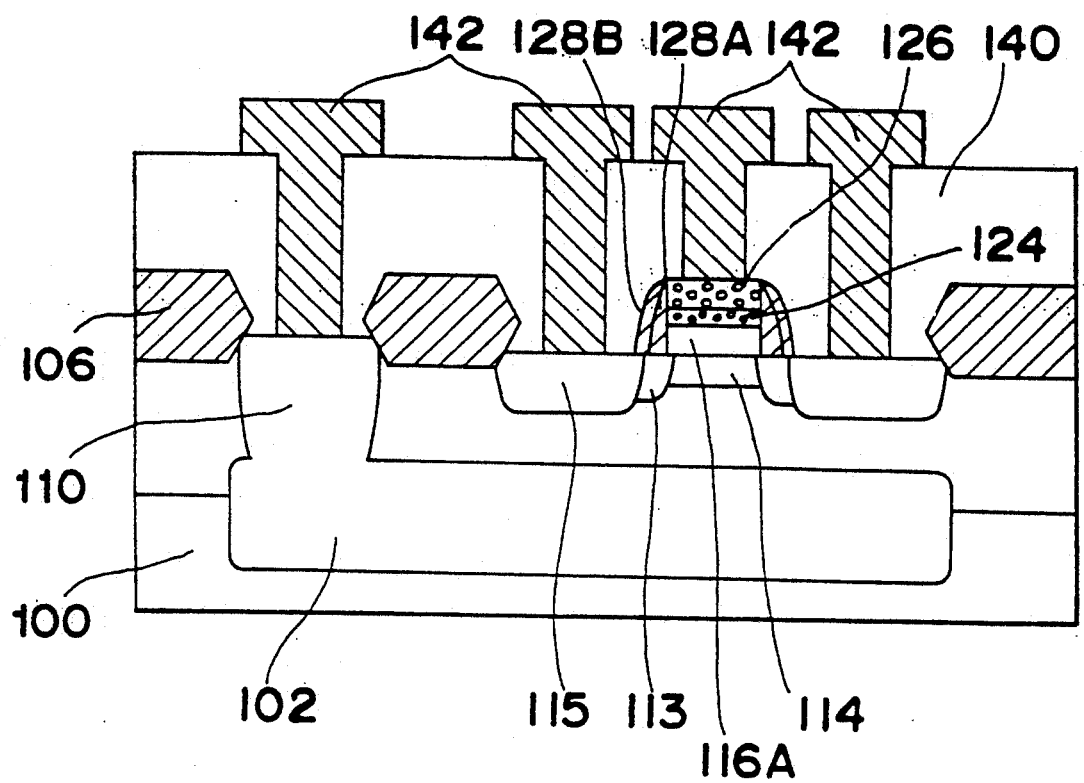
FIG. 32 shows a cross-sectional view of a major portion of a bipolar transistor obtained at the final step of a method for manufacturing a bipolar semiconductor device according to the sixth embodiment of the present invention.

The following description will be directed to a sixth embodiment of the present invention referring to FIGS. 30 to 32 showing cross-sectional views of major portions of a bipolar transistor obtained at various steps of a method for manufacturing a bipolar semiconductor device according to a sixth preferred embodiment of the present invention.

At first, steps shown in FIGS. 21 to 24 are performed similarly as in the fourth or fifth preferred embodiment.

Then, as shown in FIG. 30, a silicon oxide film is deposited with a thickness of, for example, 100 nano meter to form a first insulating film 128A forming a side wall through an anisotropic etching process. Further, a resist pattern 212 is formed. Then, a p-type semiconductor region 113 as a fifth semiconductor region forming a link base region is formed by implanting boron at a dose amount of $10^{12}$ to $10^{14}$ cm$^{-2}$ using the resist pattern and first insulating film 128A as a mask so as to have a concentration of impurity smaller than that of the external base. In this case, penetration of the link base region 113 into the emitter region 116A can be suppressed by forming the former using the ion implant.

Therefore, a contact area between the link base region 113 and the emitter region is desirably reduced resulting in prevention of reduction of the breakdown voltage, suppression of generation of hole carriers and enhancement of reliability.

A next step is to deposit a silicon oxide film with a thickness of, for example, 50 nano meter and to form a second insulating film 128B forming a side-wall through an anisotropic etching process. Further, an implantation of boron ions in a dose amount of $10^{15}$ to $10^{16}$ cm$^{-2}$ generates a p-type semiconductor region 115 of a fourth semiconductor region to be an external base region by using the resist pattern and the first and second insulating film 128A and 128B as masks (FIG. 31).

In this case, it becomes possible to increase a distance from the edge of the emitter region by providing the second insulating film 128B and, thereby, the link base region 113 is prevented from extinction upon forming the external base region 115.

Then, as shown in FIG. 32, a BPSG film 140 is deposited as a protection film on all the surface similarly as in the first preferred embodiment and is made flat by a heat treatment. After forming contact windows for emitter, collector and base on this BPSG film 140, a metal wiring pattern 142 is formed.

In such a way, the side-wall is formed by two operations; a first operation forms a link base region having a suitable impurity concentration and profile, and a second operation forms, in a self-adjusting way, the external base region by an ion implantation. This permits the emitter region and the link base region to be suitably separated from each other and not to be brought into a contact with any impurity in a high concentration. Further, the connection between an intrinsic base and the external base in ensured through the link base. In such a way, a semiconductor device according to the manufacturing method of the present invention has greatly improved reliability.

Figure 33:
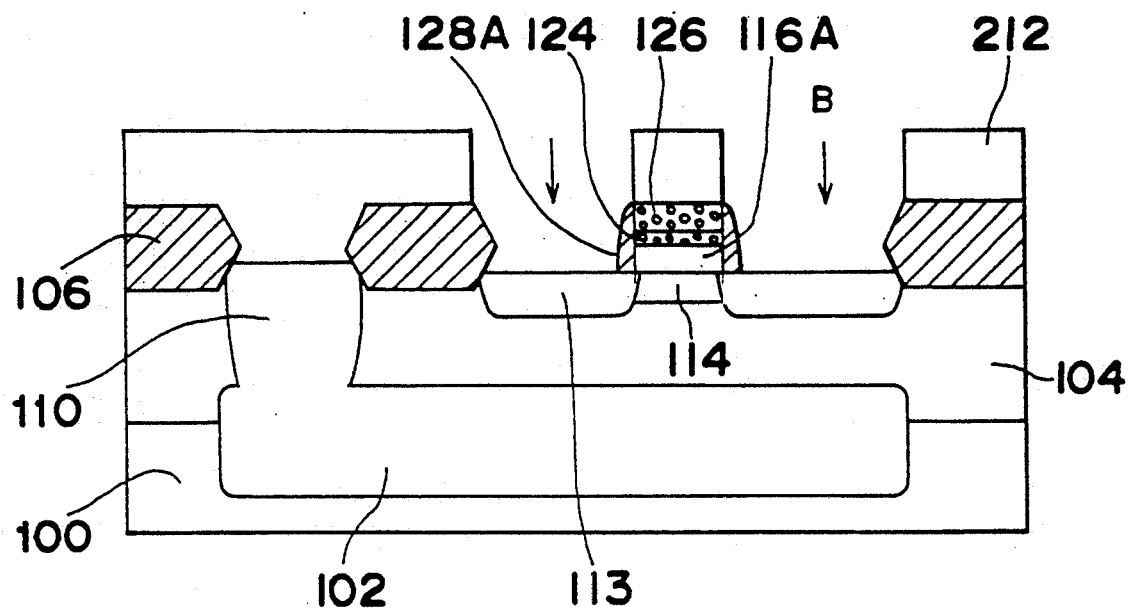
FIG. 33 shows a cross-sectional view of a major portion of a bipolar transistor obtained at the fifth step of a method for manufacturing a bipolar semiconductor device according to the seventh embodiment of the present invention.
Figure 34:
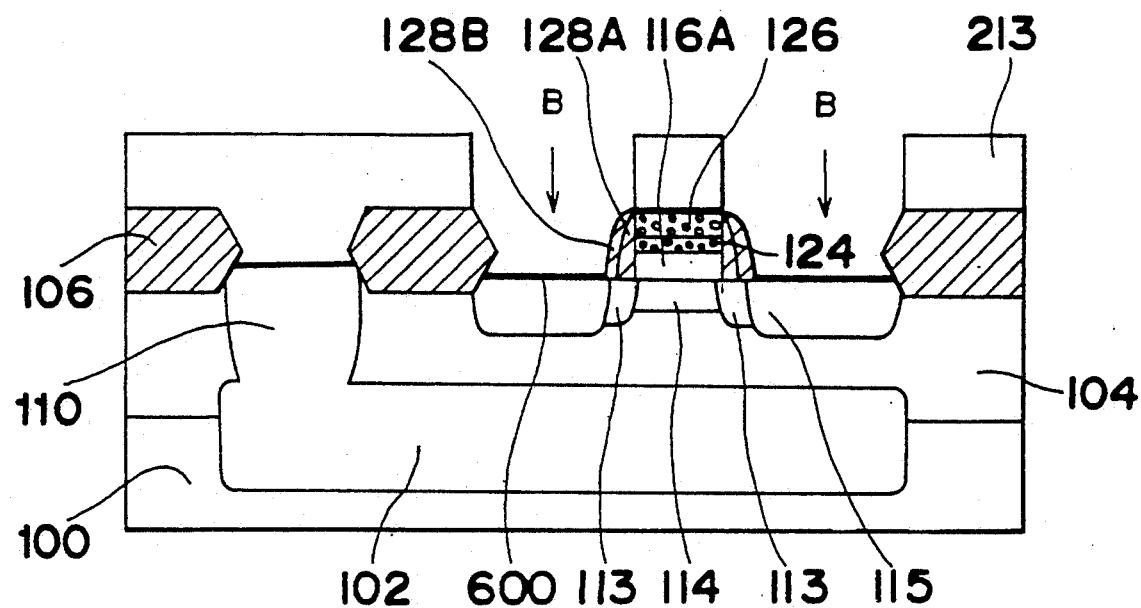
FIG. 34 shows a cross-sectional view of a major portion of a bipolar transistor obtained at the sixth step of a method for manufacturing a bipolar semiconductor device according to the seventh embodiment of the present invention.
Figure 35:
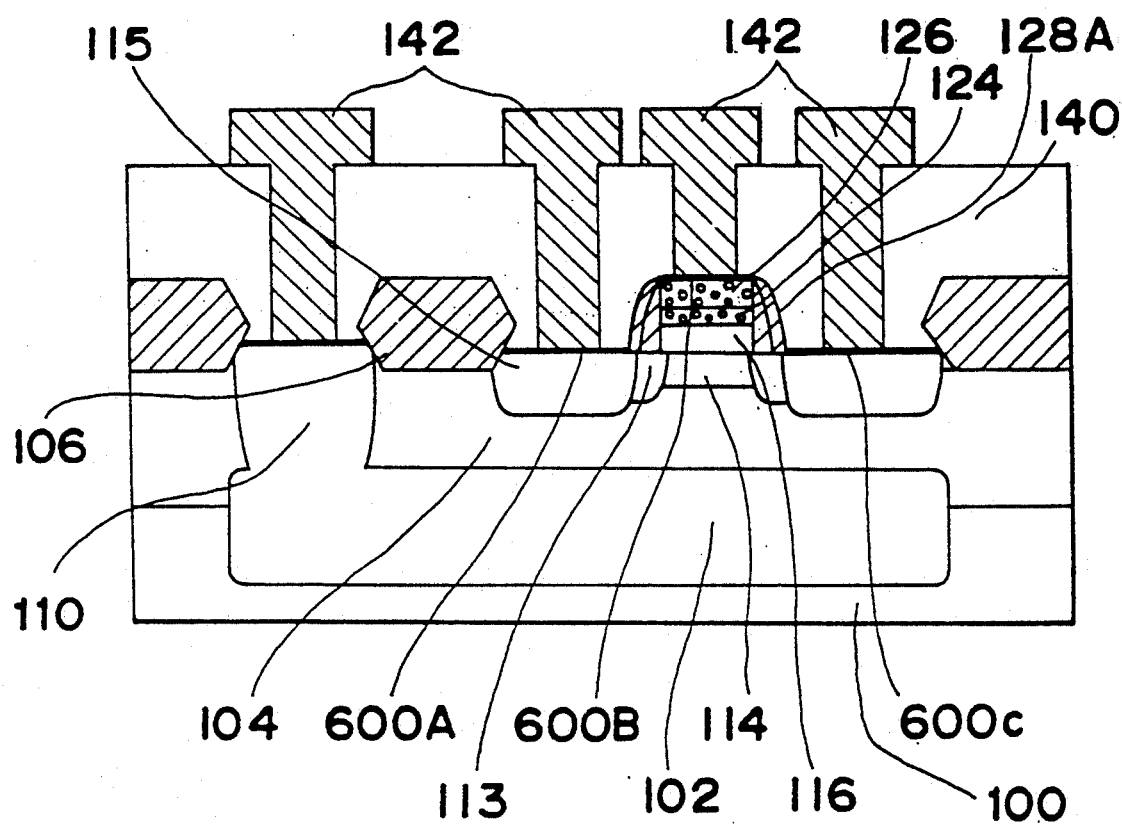
FIG. 35 shows a cross-sectional view of a major portion of a bipolar transistor obtained at the final step of a method for manufacturing a bipolar semiconductor device according to the seventh embodiment of the present invention.

Referring to FIGS. 33 to 35, the following description will be directed to a seventh embodiment of the present invention.

FIGS. 33 to 35 show cross-sectional views of major portions of bipolar transistors obtained at various steps of a method for manufacturing a bipolar semiconductor device according to the seventh embodiment of the present invention.

At first, steps shown in FIGS. 21 to 24 are performed similarly as in the fourth, fifth or sixth preferred embodiment.

A next step is to deposit a silicon oxide film in a thickness of, for example, 100 nano meter and to form a side-wall 128A to be a second insulating film through an anisotropic etching process. Further, an implantation of boron ions in a dose amount of $10^{12}$ to $10^{14}$ cm$^{-2}$ generates a p-type semiconductor region 113 as a fifth semiconductor region to be a link base region. (FIG. 33).

A next step is to deposit a silicon oxide film in a thickness of, for example, 50 nano meter and to form a sidewall 128B to be a first insulating film through an anisotropic etching process. Further, an RTA (rapid thermal annealing) method causes an alloying reaction between titanium and silicon to convert the composition of emitter electrode poly silicon, the external base region and the collector region into a composition of silicide in a self-adjusting way (silicide film 600). Further, a wet etching process carried out with the silicon oxide film removes titanium metal which is not converted into the silicide. An implantation of boron ions in a dose amount of $10^{15}$ to $10^{16}$ cm$^{-2}$ generates a p-type semiconductor region 115 region to be a external base region (FIG. 34).

A final step is to deposit an insulating film 140 such as a BPSG film on all of the surface and to make the insulating film flat by a heat treatment carried out at a temperature of, for example, 900° C. for 30 min. And then, a completion of each of wiring 142 results in a semiconductor device having a structure shown in FIG. 35.

This process for formation of silicide can be commonly applied for the silicide formation of the gate, source and drain of a CMOS and therefore can be applicable for a BiCMOS process.

It is noted that the embodiments 4, 5, 6, and 7 use a term of silicon thin film but the term includes either of amorphous silicon thin film or poly silicon thin film.

The embodiments 4 and 5 are carried out by a process comprising steps of forming a silicon thin film in a thickness of 30 nm to be an emitter electrode, forming an N+ emitter diffusion layer by implanting arsenic ions into an emitter region through the silicon thin film 124 and forming the emitter electrode composed of a poly silicon in a thickness of 300 nm after the deep etching for removing the oxide film naturally formed. The poly silicon thin film can be preferably replaced with metal silicide (tungsten siliside or molybdenum silicide) to decrease an electrical resistance.

In an etching process to etch the active region except for the intrinsic base region using of a resist pattern formed on the emitter silicon thin film in accordance with the embodiments 4, 5, 6 and 7, it is not always necessary to etch all of the n-type semiconductor region. The link base and the external base region can be formed into a p-type semiconductor by adjusting the amount of p-type impurity ions to be implanted.

A method for manufacturing a bipolar semiconductor device is to form a second and a third semiconductor regions to be an emitter and base by implanting impurity ions of a first electric conduction type and a second electric conduction type, respectively through a first semiconductor thin film of a poly silicon. The bipolar semiconductor device according to this method is improved in the ohmic contact between a second polycrystalline silicon semiconductor thin film which is to be a leading-out electrode for a transistor of a bipolar type integration circuit and a second semiconductor region which includes an impurity of a high concentration and which is formed at a first semiconductor region of a semiconductor substrate of a single crystal form. Further, the device is superior in the high speed operation and a high density integration. It is also possible to suppress the effect of a variation in the thickness of the semiconductor thin film on the electric characteristic.

A method for manufacturing a bipolar semiconductor device according to claims 2 and 3 is to form a link base region by implanting impurity ions of a first electric conduction type and a second electric conduction type, respectively through a first semiconductor thin film and by introducing, in a self-adjusting way, an impurity of a second electric conduction type at a position beneath at second insulating film through an opening formed at a first semiconductor region before the formation of a second semiconductor region of a first electric conduction type and third semiconductor region of a second electric conduction to be an emitter and a base. This structure can ensure the connection between the third semiconductor region to be a base and an external base region.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for manufacturing a bipolar semiconductor device comprising the steps of:
    forming a first semiconductor thin film of a non-single crystal on the surface of a first semiconductor region of a single crystal which is of a first electric conduction type to be a collector,
    forming a second semiconductor region of said first electric conduction type to be an emitter in said first semiconductor region by implanting an impurity of said first electric conduction type through said first semiconductor thin film,
    forming a third semiconductor region of a second electric conduction type to be a base by implanting an impurity of said second electric conduction type through said first semiconductor thin film, and
    forming a second semiconductor thin film of a non-single crystal on said first semiconductor thin film.

2. A method for manufacturing a bipolar semiconductor device comprising steps of:
    forming a base leading-out electrode film for leading-out a base composed of a semiconductor thin film of a second electric conduction type on a first semiconductor region of a first electric conduction type made of a single crystal to be a collector,
    forming a first insulating film on said base leading-out electrode film,
    forming at least one opening on said first semiconductor region by etching selectively and sequentially said base lead-out electrode film and said first insulating film,
    forming an external base (extrinsic base) region made of a semiconductor of a second electric conduction type in said first semiconductor region positioned beneath said base leading-out electrode film,
    forming a second insulating film at the side wall of said base leading-out electrode film,
    forming a link base region composed of a semiconductor region of a second electric conduction type at said first semiconductor region to link said external base by implanting an impurity of a second electric conduction type into said opening in an inclined direction,
    forming a first semiconductor thin film of a non-single crystal over all the surface,
    forming a second semiconductor region of a first electric electric conduction type to be an emitter in said first semiconductor region by implanting an impurity of a second electric conduction type through said first semiconductor thin film,
    forming a third semiconductor region of a second electric conduction type to be internal base (intrinsic base) by implanting an impurity of a second electric conduction type through said first semiconductor thin film,
    forming a second semiconductor thin film on said first semiconductor thin film, and
    patterning said first semiconductor thin film and said second semiconductor thin film formed on said opening so as to form an emitter electrode while making include an impurity of a first electric conduction type into said second semiconductor thin film.

3. A method for manufacturing a bipolar semiconductor device comprising steps of:
    forming a base leading-out electrode film for leading-out a base composed of a semiconductor thin film of a second electric conduction type on a first semiconductor region of a first electric conduction type made of a single crystal to be a collector,
    forming a first insulating film on said base leading-out electrode film,
    forming at least one opening on said first semiconductor region by etching selectively and sequentially said base leading-out electrode film and said first insulating film,
    forming an external base composed of a semiconductor region of a second electric conduction type in said first semiconductor region positioned beneath said base leading-out electrode film,
    forming a second insulating film on the side wall of said base leading-out electrode film and a third insulating film on said opening,
    forming a link base region composed of a semiconductor region of a second electric conduction type on said first semiconductor region to link said external base by implanting an impurity of second electric conduction type through said third insulating film on said opening,
    forming a first semiconductor thin film of a non-single crystal form over all the surface,
    forming a second semiconductor region of a first electric conduction type to be an emitter in said first semiconductor region by implanting an impurity of a second electric conduction type through said first semiconductor thin film, forming a third semiconductor region of a second electric conduction type to be a base at the outside of said second semiconductor region of a first electric conduction type to be an emitter by implanting an impurity of a second electric conduction type through said first semiconductor thin film, forming a second semiconductor thin film on said first semiconductor thin film, and pattering the first semiconductor thin film and the second semiconductor thin film formed on said opening so that said first and second semiconductor thin films are formed into an emitter electrode while making include an impurity of a first electric conduction type into said second semiconductor thin film.

4. A method for manufacturing a bipolar semiconductor device of a vertical type comprising steps of:

forming a first conduction film on a first semiconductor region of a first electric conduction type made of a single crystal to be a collector, forming a third semiconductor region of a second electric conduction type to be a base through said first semiconductor thin film, forming a second semiconductor region of a first electric conduction type necessary for the formation of an emitter by implanting an impurity of a first electric conduction type through said first semiconductor thin film, forming a second conduction film on said first conduction film, forming a semiconductor thin film pattern for use in a formation of an emitter electrode by patterning said first semiconductor thin film and said second semiconductor thin film;

removing selectively said third semiconductor region of a first electric conduction type except for an area forming the semiconductor thin film for use in an emitter electrode and forming a residual semiconductor region to be an emitter in a second semiconductor region at a position beneath said semiconductor thin film pattern for use in a formation of an emitter electrode, leaving said first insulating film in a side-wall form at the side of said residual semiconductor region, forming a fourth semiconductor region of a second electric conduction type to be an external base by introducing an impurity of a second electric conduction type into said first semiconductor region under use of said residual insulating film and said semiconductor thin film pattern for use in a formation of an emitter electrode as a mask, and connecting said fourth semiconductor region to said second semiconductor region.

5. The method for manufacturing a bipolar semiconductor device as claimed in claim 4 which comprises a step of forming a layer of a metal and semiconductor alloy on said fourth semiconductor region selectively.

6. A method for manufacturing a bipolar semiconductor device comprising steps of:

forming a first conduction film on a first semiconductor region of a first electric conduction type composed of single crystal to be a collector, forming a third semiconductor region of a second electric conduction type to be a base through said first semiconductor thin film, forming a second semiconductor region of a first electric conduction type necessary for the formation of an emitter by implanting an impurity of a first electric conduction type through said first semiconductor thin film, forming a second conduction film on said first conduction film, forming a semiconductor thin film pattern for use in a formation of an emitter electrode by patterning said first semiconductor thin film and said second semiconductor thin film, removing selectively said third semiconductor region of a first electric conduction type except for an area forming the semiconductor thin film for use in an emitter electrode and forming a residual semiconductor region to be an emitter in a second semiconductor region at a position beneath said semiconductor thin film pattern for use in a formation of an emitter electrode, forming a fifth semiconductor region of a second electric conduction type to be a link base by introducing an impurity of a second electric conduction type in said second semiconductor region under use of said semiconductor thin film pattern for use in a formation of an emitter electrode leaving said first insulating film in a side-wall form at the side of said residual semiconductor region after formation of said fifth semiconductor region, forming a fourth semiconductor region of a second electric conduction type to be an external base by introducing an impurity of a second electric conduction type into said first semiconductor region under use of said residual insulating film and said semiconductor thin film pattern for use in a formation of an emitter electrode as a mask, and connecting said fourth semiconductor region to said second semiconductor region through said fifth semiconductor region.

7. The method for manufacturing a bipolar semiconductor device as claimed in claim 6 which further comprises a step of forming a layer of a metal and semiconductor alloy on said fourth semiconductor region selectively.

8. A method for manufacturing a bipolar semiconductor device of a vertical type comprising steps of:

forming a first conduction film on a first semiconductor region of a first electric conduction type composed of single crystal to be a collector, forming a third semiconductor region of a second electric conduction type to be a base through said first semiconductor thin film, forming a second semiconductor region of a first electric conduction type necessary for the formation of an emitter by implanting an impurity of a first electric conduction type through said first semiconductor thin film, forming a second conduction film on said first conduction film, forming a semiconductor thin film pattern for use in a formation an emitter electrode by patterning said first semiconductor thin film and said second semiconductor thin film, removing selectively said third semiconductor region of a first electric conduction type except for an area forming the semiconductor thin film for use in an emitter electrode and forming a residual semiconductor region to be an emitter in a second semiconductor region at a position beneath said semiconductor thin film pattern for use in a formation of an emitter electrode, leaving said first insulating film in a side-wall form at the side of said residual semiconductor region, forming a fifth semiconductor region of a second electric conduction type to be a link base by introducing an impurity of a second electric conduction type in said first semiconductor region under use of said residual insulating film and said semiconductor thin film pattern for use in a formation of an emitter electrode as a mask and connecting said fifth semiconductor region to said second semiconductor region, leaving said second insulating film in a side-wall form at the side of said first insulating film left in a side-wall form after formation of said fifth semiconductor region, forming a fourth semiconductor region of a second electric conduction type to be an external base by introducing an impurity of a second electric conduction type into said first semiconductor region under use of said residual insulating film and said semiconductor thin film pattern for use in a formation of an emitter electrode as a mask, and connecting said fourth semiconductor region to said fifth semiconductor region.

9. A method for manufacturing a bipolar semiconductor device as claimed in claim 8 which further comprises a step of forming a layer of a metal and semiconductor alloy on said fourth semiconductor region selectively.

10. A method for manufacturing a bipolar semiconductor device comprising the steps of:

forming a first semiconductor region of a second conductive type acting as a collector on a substrate of a first conductive type;

forming an oxide film on said first semiconductor region;

forming a collector wall diffusion layer by implanting an impurity of said second conductive type;

forming a link base region of said first conductive type;

forming an entire surface layer of insulating film;

forming a first resist pattern over said insulating film;

forming an opening in said resist pattern through said insulating film and said oxide film;

removing said first resist pattern and depositing a first semiconductor thin film thereon;

forming a second semiconductor region of said second conductive type to be an emitter in said first semiconductor region through said first semiconductor thin film;

forming a third semiconductor region to be a base by implanting ions of said first conductive type through said first semiconductor thin film; and forming a second semiconductor thin film on said first semiconductor thin film.

11. The method according to claim 10, further comprising the steps of:

forming a second resist pattern on said second semiconductor thin film;

forming an electrode for connecting said emitter through etching using said second resist pattern as a mask;

removing said second resist pattern and depositing an oxide film for use as a side wall;

forming a graft base region by ion implantation; and depositing a protecting film over the entire surface of said bipolar semiconductor device.

* * * * *